(12) United States Patent
Kiriishi et al.

(10) Patent No.: US 12,024,632 B2
(45) Date of Patent: Jul. 2, 2024

(54) NEAR INFRARED ABSORBING COMPOSITION, NEAR INFRARED CUT FILTER, SOLID STATE IMAGE SENSOR, AND CAMERA MODULE

(71) Applicant: Konica Minolta, Inc., Tokyo (JP)

(72) Inventors: Natsumi Kiriishi, Hino (JP); Koji Daifuku, Hino (JP); Takayuki Suzuki, Kokubunji (JP); Kiyoshi Fukusaka, Fussa (JP)

(73) Assignee: KONICA MINOLTA, INC., Tokyo (JP)

( * ) Notice: Subject to any disclaimer, the term of this patent is extended or adjusted under 35 U.S.C. 154(b) by 451 days.

(21) Appl. No.: 17/469,052

(22) Filed: Sep. 8, 2021

(65) Prior Publication Data

US 2022/0098417 A1    Mar. 31, 2022

(30) Foreign Application Priority Data

Sep. 25, 2020   (JP) .................................. 2020-160339

(51) Int. Cl.
*C09B 67/20*    (2006.01)
*C08K 5/41*    (2006.01)
(Continued)

(52) U.S. Cl.
CPC ............ *C09B 67/0063* (2013.01); *C08K 5/41* (2013.01); *C08K 5/521* (2013.01); *C08K 5/5333* (2013.01);
(Continued)

(58) Field of Classification Search
CPC ... C09B 67/0033; C09B 67/0063; G02B 1/04; G02B 5/208; H01L 27/1462; C08K 5/41;
(Continued)

(56) References Cited

U.S. PATENT DOCUMENTS

2018/0282521 A1*    10/2018   Kubo .................... C08K 5/521

FOREIGN PATENT DOCUMENTS

JP       4500417 B2    7/2010
JP    2011099038 A    5/2011
(Continued)

OTHER PUBLICATIONS

Office Action issued on Mar. 13, 2023 for the related Taiwanese Application No. 110127487, with English translation, 11 pages.
(Continued)

*Primary Examiner* — Bijan Ahvazi
(74) *Attorney, Agent, or Firm* — LUCAS & MERCANTI, LLP

(57) ABSTRACT

A near infrared absorbing composition includes a near infrared absorber. The near infrared absorber contains at least one of Ingredient (A) and Ingredient (B). Ingredient (A) consists of a first compound having a first structure represented by General Formula (I), a second compound having a second structure represented by General Formula (II), and a copper ion. Ingredient (B) consists of a first copper complex in which the first compound is coordinated and a second copper complex in which the second compound is coordinated. In General Formula (I), $R^1$ represents an alkyl group containing 1-20 carbons or an aryl group containing 6-20 carbons, and may further have a substituent. In General Formula (II), $R^2$ represents an alkyl group containing 1-20 carbons or an aryl group containing 6-20 carbons, and may further have a substituent.

General Formula (I)

(Continued)

-continued

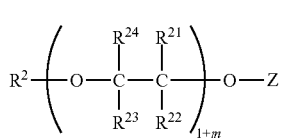

General Formula (II)

12 Claims, 1 Drawing Sheet

(51) Int. Cl.
  *C08K 5/521* (2006.01)
  *C08K 5/5333* (2006.01)
  *C09B 67/22* (2006.01)
  *G02B 1/04* (2006.01)
  *G02B 5/20* (2006.01)
  *H01L 27/146* (2006.01)

(52) U.S. Cl.
  CPC ............ *C09B 67/0033* (2013.01); *G02B 1/04* (2013.01); *G02B 5/208* (2013.01); *H01L 27/1462* (2013.01); *C08K 2201/014* (2013.01)

(58) Field of Classification Search
  CPC ... C08K 5/521; C08K 5/533; C08K 2201/014
  See application file for complete search history.

(56) References Cited

FOREIGN PATENT DOCUMENTS

| | | | | |
|---|---|---|---|---|
| JP | 5554048 | B2 | 7/2014 | |
| JP | 5611631 | B2 | 10/2014 | |
| JP | 2019028162 | A | 2/2019 | |
| JP | 2019028163 | A | 2/2019 | |
| JP | 2020105409 | A | * 7/2020 | ............... C07F 9/09 |
| JP | 2020105409 | A | 7/2020 | |
| WO | 2017/051512 | A1 | 3/2017 | |
| WO | 2019/181587 | A1 | 9/2019 | |

OTHER PUBLICATIONS

Japanese Patent Office, "Notice of Reasons for Refusal", mailed Mar. 12, 2024, which was issued for the corresponding Japanese Patent Application No. 2020-160339, with English translation, 8 pages.

Japanese Patent Office, "Search Report by Registered Search Organization", mailed Mar. 13, 2024, which was issued for the corresponding Japanese Patent Application No. 2020-160339, with English translation, 19 pages.

* cited by examiner

NEAR INFRARED ABSORBING COMPOSITION, NEAR INFRARED CUT FILTER, SOLID STATE IMAGE SENSOR, AND CAMERA MODULE

BACKGROUND

1. Technical Field

The present invention relates to a near infrared absorbing composition, a near infrared cut filter, a solid state image sensor, and a camera module.

More specifically, the present invention relates to a near infrared absorbing composition, etc. having high near infrared absorbing property, moisture resistance, and heat resistance while being thin.

2. Description of Related Art

In recent years, CCD and CMOS image sensors, which are solid state image sensors for color images, have been used in video cameras, digital still cameras, mobile phones with camera functions, and the like. These solid state image sensors use silicon photodiodes that are sensitive to light in a near infrared wavelength region in their light-receiving unit (light-receiving element). Therefore, luminosity factor needs to be corrected. A near infrared cut filter is often used for that.

Various near infrared absorbers made from a phosphate ester compound, a phosphonic acid compound, a compound serving as a copper ion source, etc., are disclosed as near infrared absorbers for forming a near infrared ray absorbing layer in such a near infrared ray cut filter.

For example, Japanese Patent No. 4500417 discloses an optical material consisting of a phosphonic acid compound, metal ions, and at least one of a phosphonic acid monoester compound, a phosphinic acid compound, a phosphoric acid diester compound and a phosphoric acid monoester compound. An optical material having improved spectral characteristics and compatibility with resin can be obtained.

WO 2017/051512A discloses a composition for an infrared absorbing layer consisting of copper ions, phosphonic acid, and at least one of a phosphoric acid diester and a phosphoric acid monoester. A content of the phosphoric acid is less than 2.5 times a content of the phosphate ester compound on a molar basis. According to the document, optical characteristics in an infrared region and a visible region which are desirable as a cut filter can be obtained.

Japanese Patent No. 5611631 discloses a near infrared absorber consisting of a phosphonic acid compound, a phosphate ester compound, and a copper salt. A near infrared cut filter which suitably absorbs near infrared rays and which has excellent transparency can be obtained.

Japanese Patent No. 5554048 discloses a near infrared absorber consisting of a phosphonic acid compound, monopolyoxyethylene alkyl phosphate ester compounds, and copper ions. An optical material having excellent transparency and heat resistance can be obtained.

However, it has been difficult to produce a near infrared absorbing film which is thin and which has high near infrared absorbing property in the methods disclosed in the above patent documents.

In the methods disclosed in the above patent documents, effect of a phosphate ester compound as a dispersant is not sufficient. If a content of the phosphate ester compound is increased in consideration of dispersibility for near infrared absorption, a film becomes thicker. On the contrary, if the content of the phosphate ester compound is suppressed in consideration of film thickness, dispersibility becomes insufficient. There has been such a trade-off.

Therefore, from a viewpoint of handling and miniaturization of the solid state image sensor, a near infrared absorbing composition capable of forming a near infrared absorbing film having high near infrared absorbing property while being thin is required.

The near infrared absorbing composition containing a phosphate ester compound also has a problem in moisture resistance and heat resistance. Sone phosphate ester compounds that do not interact with other ingredients such as copper ions are hydrolyzed in a hot and humid environment. It generates visible precipitates to cause cloudiness.

SUMMARY OF INVENTION

The present invention has been made in view of the above problems and circumstances. An object of the present invention is to provide a near infrared absorbing composition, etc. having high near infrared absorbing property, moisture resistance, and heat resistance while being thin.

The present inventor has investigated causes of the above problems to achieve the above object.

As a result, the inventor has found that a near infrared absorbing composition, etc. having high near infrared absorbing property, moisture resistance, and heat resistance while being thin can be obtained by:
  adjusting a content ratio of ingredients; and
  limiting a structure of a phosphate ester compound or a sulfate ester compound that acts as a dispersant to a specific structure.

Thus, the present invention was made.

To achieve the above object, according to an aspect of the present invention, a near infrared absorbing composition includes:
  a near infrared absorber that contains at least one of:
    Ingredient (A) that consists of a first compound having a first structure represented by General Formula (I), a second compound having a second structure represented by General Formula (II), and a copper ion, and

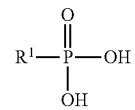

General Formula (I)

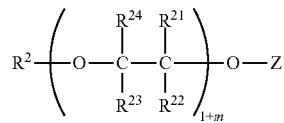

General Formula (II)

Ingredient (B) that consists of a first copper complex in which the first compound is coordinated and a second copper complex in which the second compound is coordinated,
  wherein
  in General Formula (I). $R^1$ represents an alkyl group containing 1-20 carbons or an aryl group containing 6-20 carbons, and may further have a substituent,
  in General Formula (II), $R^2$ represents an alkyl group containing 1-20 carbons or an aryl group containing 6-20 carbons, and may further have a substituent, each of $R^{21}$ to $R^{24}$ represents a hydrogen atom or an alkyl group containing 14 carbons, "l" represents an average number of added partial structures in which $R^{21}$ to $R^{24}$ are all hydrogen atoms, and is in a range of 1-19, "m" represents an average number of added partial structures in which at least one of $R^{21}$ to $R^{24}$ is an alkyl group containing 14 carbons, and is in the range of 1-19, "l+m" is a sum of "l" and "n", and is in a range of 2-20.

"Z" represents a structural unit selected from General Formulae (Z-1) to (Z-3),

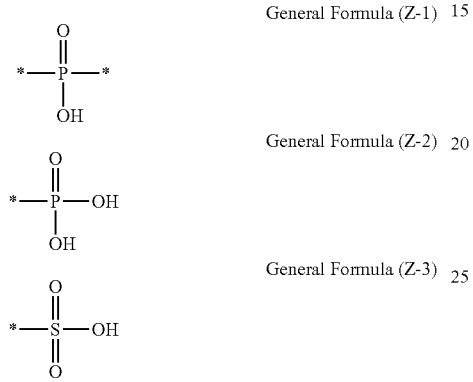

"*" represents a binding site and is combined with "O" in General Formula (II), a molar ratio CA/CE is in a range of 2.5-50, wherein
  CA is a molar content of the first compound, and
  CE is a molar content of the second compound, and
a molar ratio CH/CC is in a range of 1.5-2.5, wherein
  CC is a molar content of copper ions, and
  CH is a molar content of reactive hydroxy groups contained in the first compound and the second compound.

Although mechanism of generation or action of effect of the present invention has not been clarified, it is presumed as follows.

A molar ratio CA/CE of the near infrared absorber according to the present invention is in the range of 2.5-50. CA is a molar content of the first compound (copper phosphonate complex). CE is a molar content of the second compound (phosphate ester compound or sulfate ester compound).

A molar ratio CA/CE of 2.5 or more increases a proportion of copper phosphonate complex, which is effective for absorption of near infrared rays, to improve absorption of near infrared rays. A small proportion of an ester compound, which causes cloudiness in a hot and humid environment, improves moisture resistance and heat resistance.

Since the molar ratio CA/CE is 50 or less, a certain amount of the phosphate ester compound or the sulfate ester compound exists. It improves dispersibility of complex microparticles.

A molar ratio CH/CC of the near infrared absorber according to the present invention is in the range of 1.5-2.5. CC is a molar content of copper that constitutes a copper ion or a copper compound.

CH is a molar content of reactive hydroxy groups contained in the first compound and the second compound.

A molar ratio CH/CC within the range increases visible light transmittance in a wavelength range of 400-700 nm. There is no leakage of transmitted light around 1,100 nm in the near infrared region. Absorption performance is maintained efficiently. Even at 700 nm, which is an end of the long wavelength of visible light, spectroscopic transmission characteristics having a certain degree of absorption is obtained. It is suitable for correcting luminosity factor.

In the second compound according to the present invention (phosphate ester compound or sulfate ester compound), each of an average number "l" of added ethylene oxide structures and an average number "m" of added alkylated ethylene oxide structures is one or more.

Structures of phosphoric acid and sulfuric acid have a high ability to form a complex with a metal and contribute to enhancement of effect as a dispersant. Combination with ethylene oxide structures and alkylated ethylene oxide structures increases variety of isomers. It contributes to increase of entropy and enhancement of effect as a dispersant. Enhanced dispersibility improves storage stability of dispersion. Improvement of effect as a dispersant suppresses a content of the compound. It makes it possible to make a thin film and to improve moisture resistance and heat resistance when filmed.

It is considered that this mechanism of generation or action provides a near infrared absorbing composition having high near infrared absorbing property, moisture resistance, and heat resistance while being thin.

BRIEF DESCRIPTION OF DRAWINGS

The advantages and features provided by one or more embodiments of the invention will become more fully understood from the detailed description given hereinbelow and the appended drawings which are given by way of illustration only, and thus are not intended as a definition of the limits of the present invention.

DESCRIPTION OF EMBODIMENTS

Figure 1:
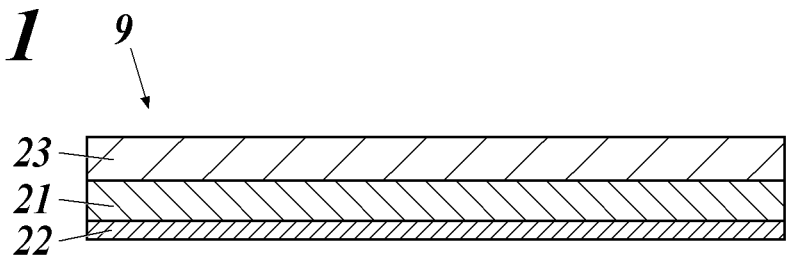
FIG. 1 is a schematic cross-sectional view showing an example of configuration of a near infrared cut filter.

Hereinafter, one or more embodiments of the present invention will be described with reference to the drawings. However, the scope of the invention is not limited to the disclosed embodiments.

A near infrared absorbing composition of the present invention contains a near infrared absorber. The near infrared absorber contains at least one of Ingredient (A) and Ingredient (B) shown below.

A molar ratio CA/CE is in the range of 2.5-50. CA is a molar content of the first compound having the structure represented by General Formula (II). CE is a molar content of the second compound having the second structure represented by General Formula (II).

A molar ratio CH/CC is in the range of 1.5-2.5 CC is a molar content of copper ions.

CH is a total molar content of the reactive hydroxy groups contained in the first compound and the second compound.

Ingredients

Ingredient (A) consists of the first compound, the second compound, and a copper ion.

Ingredient (B) consists of:
  a copper complex in which the first compound is coordinated; and a copper complex in which the second compound is coordinated.

This feature is a technical feature common to or corresponding to the embodiments described below.

For near infrared absorption, moisture resistance and heat resistance, the molar ratio CA/CE is preferably in a range of 3.8-10.

For near infrared absorption, moisture resistance and heat resistance, $R^1$ in General Formula (I) is preferably an alkyl group containing 1-20 carbons.

To adjust an absorption wavelength, an organic dye is preferably contained.

For sufficient near infrared absorption and high visible light transmittance and heat resistance, the organic dye is preferably a quaterylene derivative, a phthalocyanine derivative, a cyanine derivative, or a squarylium derivative.

The near infrared absorbing composition of the present invention may further contain a curable resin to be in a state of a cured film.

To be a thin film and to have good near infrared absorption at the same time, it is preferable that:
   an average spectral transmittance is 8 W or more in a wavelength range of 450-600 nm;
   an average spectral transmittance is 10% or less in a wavelength range of 850-1,000 nm; and
   a film thickness is in a range of 10-150 μm.

To be a thin film and to have near infrared absorption suitable for correcting luminosity factor at the same time, it is preferable that:
   an average spectral transmittance is 1% or less in a wavelength range of 750-1,080 nm;
   a spectral transmittance decreases as a wavelength increases in a wavelength range of 600-700 nm;
   a cutoff wavelength for light incident on a surface at an incident angle of 0° is in a range of 600-680 nm, the cutoff wavelength being a wavelength in which a spectral transmittance is 50% in the wavelength range of 600-700 nm; and
   a film thickness is in a range of 10-100 μm.

A near infrared cut filter of the present invention includes a near infrared absorbing layer on at least one side of a transparent dielectric substrate. The near infrared absorbing layer contains the near infrared absorbing composition of the present invention.

To more freely adjust spectral characteristics of the near infrared cut filter, the near infrared cut filter of the present invention preferably includes a dielectric multilayer film on at least one side of the transparent dielectric substrate.

A solid state image sensor of the present invention includes the near infrared cut filter of the present invention.

A camera module of the present invention includes the near infrared absorbing composition of the present invention.

Hereinafter, the present invention, its components, and embodiments and examples for carrying out the present invention will be described in detail. In the description, numerical values before and after "-" are included as a lower limit value and an upper lit value.

(1) Summary of Near Infrared Absorbing Composition

The near infrared absorbing composition of the present invention is characterized by a near infrared absorber contained therein. It may further contain organic dyes, ultraviolet absorbers and other additives.

The near infrared absorbing composition of the present invention may be in a state of dispersion in which ingredients such as a near infrared absorber are dispersed in a solvent, or in a state of a film cured together with a curable resin.

(1.1) Near Infrared Absorber

The near infrared absorber according to the present invention contains at least one of following Ingredient (A) and Ingredient (B).

Ingredients

Ingredient (A)—following three types of ingredients
   the first compound having the structure represented by General Formula (I)
   the second compound having the structure represented by General Formula (II)
   a copper ion Ingredient (B)—following two types of ingredients
   the copper complex in which the first compound is coordinated
   the copper complex in which the second compound is coordinated Hereinafter, the ingredients will be described.

First Compound Having Structure Represented by General Formula (I)

The first compound is a phosphonic acid compound, and can absorb near infrared rays by forming a copper phosphonate complex described later.

Structure Represented by General Formula (I)

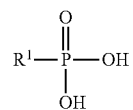

General Formula (I)

In General Formula (I), $R^1$ represents an alkyl group containing 1-20 carbons or an aryl group containing 6-20 carbons, and may further have a substituent. For moisture resistance, heat resistance and near infrared absorption. $R^1$ is preferably an alkyl group containing 1-20 carbons. To have both near infrared absorption and visible light transparency, $R^1$ is more preferably an alkyl group containing 14 carbons.

The first compound in which $R^1$ is an alkyl group containing 1-20 carbons is, for example, methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, or decylphosphonic acid.

The first compound in which $R^1$ is an aryl group containing 6-20 carbons is, for example, phenylphosphonic acid, 4-methoxyphenylphosphonic acid, (4-aminophenyl-1) phosphon acid. (4-bromophenyl) phosphonic acid, 3-phosphonobenzoic acid, 4-phosphonobenzoic acid, and (4-hydroxyphenyl) phosphonic acid.

A substituent that may be contained in $R^1$ is, for example, an alkyl group (such as methyl group, ethyl group, trifluoromethyl group, and isopropyl group), an alkoxy group (such as methoxy group and ethoxy group), and a halogen atom (such as fluorine atom), a cyano group, a intro group, a dialkylamino group (such as dimethylamino group), a trialkylsilyl group (such as trimethylsilyl group), a triarylsilyl group (such as triphenylsilyl group), a triheteroarylsilyl group (such as tripyridylsilyl group), a benzyl group, or a heteroaryl group (such as pyridyl group and carbazolyl group). A fused ring is, for example, 9,9'-dimethylfluorene, carbazole, or dibenzofuran.

The following compounds (H-1) to (H-8) are examples of compounds having the structure represented by General Formula (I).

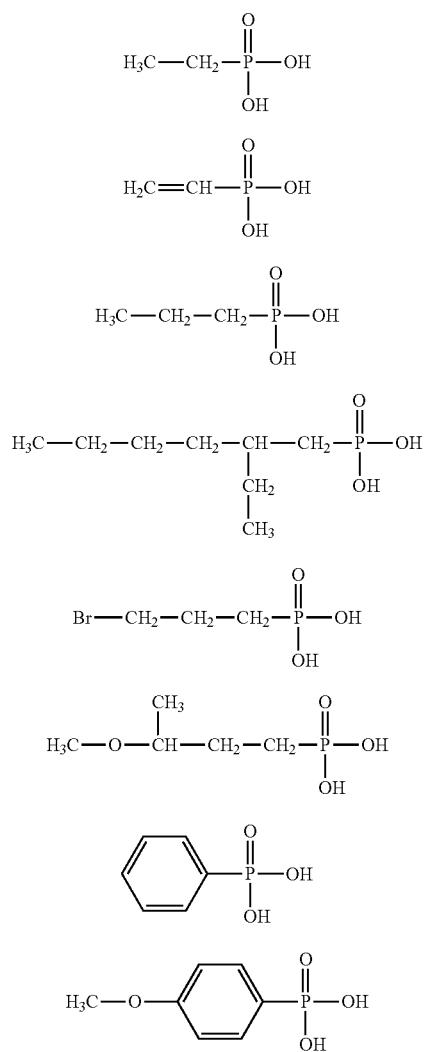

In the present invention, the first compound (phosphonic acid compound) is preferably at least one alkylphosphonic acid selected from the following phosphonic acid compound group.

1 methylphosphonic acid
2 ethylphosphonic acid
3 propylphosphonic acid
4 butyl phosphonic acid
5 phenyl phosphonic acid
6 hexylphosphonic acid
7 octyl phosphonic acid
8 2-ethylhexyl phosphonic acid
9 2-chloroethyl phosphonic acid
10 3-bromopropyl phosphonic acid
11 3-methoxybutylphosphonic acid
12 1,1-dimethylpropylphosphonic acid
13 1,1-dimethylethylphosphonic acid
14 1-methylpropylphosphonic acid Second Compound Having Structure Represented by General Formula (II)

The second compound is a phosphate ester compound or a sulfate ester compound. It disperses the phosphone copper acid complex. It suppresses increase in a diameter of a particle formed by the phosphone copper acid complex.

Structure Represented by General Formula (II)

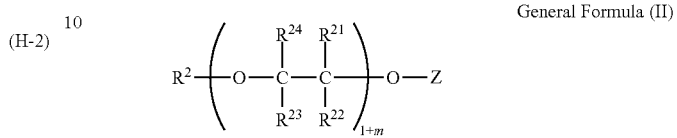

In General Formula (II), $R^2$ represents an alkyl group containing 1-20 carbons or an aryl group containing 6-20 carbons, and may further have a substituent.

In General Formula (II), the alkyl group containing 1-20 carbons which is represented by $R^2$ may be linear or branched, and is, for example, a methyl group, an ethyl group, an n-propyl group, an isopropyl group, an n-butyl group, a tert-butyl group, an n-hexyl group, a 2-ethylhexyl group, an n-octyl group, a 2-butyloctyl group, a 2-hexyloctyl group, an n-decyl group, a 2-hexyldecyl group, an n-dodecyl group, or an n-stearyl group. These alkyl groups may further have a substituent. For dispersibility of the copper complex, moisture resistance and heat resistance, the alkyl group preferably contains 6-16 carbons.

The aryl group containing 6-20 carbon atoms which is represented by $R^2$ is, for example, a phenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, or a biphenylyl group, and preferably the phenyl group, the naphtyl group, the fluorenyl group, the phenanthryl group, the biphenylyl group, or the fluorenonyl group. These aryl groups may further have a substituent.

A substituents that may be contained in $R^1$ is, for example, an alkyl group (such as methyl group, ethyl group, trifluoromethyl group, and isopropyl group), an alkoxy group (such as methoxy group and ethoxy group), a halogen atom (such as fluorine atom), a cyano group, a nitro group, a dialkylamino group (such as dimethylamino group), a trialkylsilyl group (such as trimethylsilyl group), a triarylsilyl group (such as triphenylsilyl group), a triheteroarylsilyl group (such as tripyridylsilyl group), a benzyl group, an aryl group (such as phenyl group), or a heteroaryl group (such as pyridyl group and carbazolyl group). A fused ring is, for example, 9,9'-dimethylfluorene, carbazole, dibenzofuran, and is not limited.

In General Formula (II), each if $R^{21}$ to $R^{24}$ represents a hydrogen atom or an alkyl group containing 1-4 carbons. In the description, the partial structure in parentheses in the formula in a case where $R^{21}$ to $R^{24}$ are all hydrogen atoms is also referred to as an "ethylene oxide structure". In a case where at least one of $R^{21}$ to $R^{24}$ is an alkyl group containing 14 carbons and others are hydrogen atoms, the partial structure in parentheses in the formula is also referred to as an "alkylated ethylene oxide structure".

The alkyl group containing 1 to 4 carbons which is represented by $R^{21}$ to $R^4$ is, for example, a methyl group, an ethyl group, an n-propyl group, or an n-butyl group. For dispersibility of the copper complex, the alkyl group is preferably the methyl group.

In General Formula (II), "l" represents an average number of added partial structures (ethylene oxide structures) in which $R^{21}$ to $R^{24}$ are all hydrogen atoms. The "l" is in a range of 1-19.

In General Formula (II), "m" is an average number of added partial structures (alkylated ethylene oxide structures) in which at least one of $R^{21}$ to $R^{24}$ is an alkyl group containing 14 carbons and others are hydrogen atoms. The "m" is in a range of 1-19.

In General Formula (II). "l+m" is the sum of the average addition number "l" and the average addition number "m" The "l+nm" is in a range of 2-20.

In the second compound according to the present invention, the structure of phosphoric acid and sulfuric acid, in which the average number "l" of added ethylene oxide structures and the average number "m" of added alkylated ethylene oxide structures are both one or more, has a high ability to form a complex with a metal and enhances effect as a dispersant. Combination with ethylene oxide structures and alkylated ethylene oxide structures increases variety of isomers. Entropy increases. It enhances an effect as a dispersant. Enhanced dispersibility improves storage stability of dispersion. The improved effect as a dispersant suppresses content of the compound. It makes it possible to make a thin film and to improve moisture resistance and heat resistance when filmed.

As described above, the second compound according to the present invention is characterized by the average addition number "l" and the average addition number "m" both in the range of 1-19. Preferably, the average addition number "l" and the average addition number "m" are both in the range of 1-5. In this case, effects of the ethylene oxide structure and the alkylated ethylene oxide structure are exhibited in a well-balanced manner. Further a film can be made thinner.

In General Formula (II), "Z" represents a structural unit selected from following General Formulae (Z-1) to (Z-3).

General Formula (Z-1)

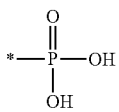

General Formula (Z-2)

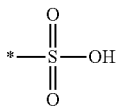

General Formula (Z-3)

In General Formulae (Z-1) to (Z-3), "*" represents a binding site and is combined with "O" in General Formula (II).

When Z is (Z-1), it is a diester. When Z is (Z-2) or (Z-3), it is a monoester.

Regarding a mixing ratio of the diester and the monoester, a molar ratio of the monoester to the sum of diester and monoester is preferably in a range of 20-95%

Second Compound

Hereinafter, examples of the second compound will be described.

First, examples of the second compound are listed in Tables I to IV below. The second compound according to the present invention is not limited to those compounds.

In Tables I to IV, the "ethylene oxide structure" is the partial structure in which $R^{21}$ to $R^{24}$ are all hydrogen atoms. The "alkylated ethylene oxide structure" is the partial structure in which at least one of $R^{21}$ to $R^{24}$ is an alkyl group containing 14 carbons and others are hydrogen atoms.

In Tables I-IV, the column "Z—Structure" indicates whether "Z" in the formula is (Z-1), (Z-2), or (Z-3).

Compound examples which include both (Z-1) and (Z-2) are mixtures of:
a compound in which Z is (Z-1), and
a compound in which Z is (Z-2).

In Tables, the column of "Z–molar ratio of monoester (%)" indicates a molar ratio of monoester (%).

TABLE I

| | | | Ethylene Oxide Structure | | Alkylated Ethylene Oxide Structure | | | | | Z | |
|---|---|---|---|---|---|---|---|---|---|---|---|
| Compound Example Number | Substituent | $R^2$ Number of Carbon Atoms | Average Number of Added Structures l | $R^{21}$~$R^{24}$ | Average Number of Added Structures m | $R^{21}$ | $R^{22}$ | $R^{23}$ | $R^{24}$ | Structure | Monoester Molar Ratio (%) |
| 1 | methyl | 1 | 5 | H | 5 | H | H | methyl | H | Z-1, Z-2 | 50 |
| 2 | methyl | 1 | 19 | H | 5 | H | H | methyl | H | Z-1, Z-2 | 50 |
| 3 | methyl | 1 | 5 | H | 5 | H | H | ethyl | H | Z-1, Z-2 | 50 |
| 4 | methyl | 1 | 5 | H | 5 | H | H | methyl | H | Z-1, Z-2 | 70 |
| 5 | methyl | 1 | 5 | H | 5 | H | H | butyl | H | Z-1, Z-2 | 50 |
| 6 | methyl | 1 | 10 | H | 5 | H | H | methyl | H | Z-3 | 100 |
| 7 | ethyl | 2 | 5 | H | 4 | H | H | methyl | H | Z-1, Z-2 | 50 |
| 8 | ethyl | 2 | 19 | H | 3 | H | H | methyl | H | Z-1, Z-2 | 50 |
| 9 | ethyl | 2 | 9 | H | 9 | H | H | H | methyl | Z-1, Z-2 | 30 |
| 10 | ethyl | 2 | 8 | H | 8 | H | H | methyl | H | Z-1, Z-2 | 50 |
| 11 | ethyl | 2 | 8 | H | 8 | methyl | H | H | H | Z-3 | 100 |
| 12 | n-propyl | 3 | 3 | H | 3 | H | H | methyl | H | Z-1, Z-2 | 50 |
| 13 | n-propyl | 3 | 15 | H | 15 | H | H | methyl | H | Z-1, Z-2 | 50 |
| 14 | n-propyl | 3 | 1.5 | H | 3 | H | H | methyl | H | Z-1, Z-2 | 50 |
| 15 | n-propyl | 3 | 3 | H | 3 | H | H | methyl | H | Z-1, Z-2 | 70 |
| 16 | n-propyl | 3 | 3 | H | 3 | methyl | H | methyl | H | Z-1, Z-2 | 50 |
| 17 | n-propyl | 3 | 5 | H | 5 | H | H | methyl | H | Z-3 | 100 |
| 18 | isopropyl | 3 | 3 | H | 3 | H | H | ethyl | H | Z-3 | 100 |
| 19 | isopropyl | 3 | 10 | H | 10 | H | H | ethyl | H | Z-1, Z-2 | 50 |
| 20 | isopropyl | 3 | 2 | H | 1.5 | methyl | H | methyl | H | Z-1, Z-2 | 20 |

TABLE II

| | | Ethylene Oxide Structure | | Alkylated Ethylene Oxide Structure | | | | | Z | |
|---|---|---|---|---|---|---|---|---|---|---|
| | $R^2$ | | | | | | | | | |
| Compound Example Number | Substituent | Number of Carbon Atoms | Average Number of Added Structures l | $R^{21}$~$R^{24}$ | Average Number of Added Structures m | $R^{21}$ | $R^{22}$ | $R^{23}$ | $R^{24}$ | Structure | Monoester Molar Ratio (%) |
| 21 | isopropyl | 3 | 5 | H | 5 | H | H | methyl | H | Z-1, Z-2 | 80 |
| 22 | n-butyl | 4 | 2 | H | 2 | H | H | methyl | H | Z-1, Z-2 | 50 |
| 23 | n-butyl | 4 | 1 | H | 1 | H | H | ethyl | H | Z-1, Z-2 | 30 |
| 24 | n-butyl | 4 | 1.5 | H | 1.5 | H | methyl | H | H | Z-1, Z-2 | 50 |
| 25 | n-butyl | 4 | 2 | H | 4 | H | H | methyl | H | Z-1, Z-2 | 50 |
| 26 | n-butyl | 4 | 3 | H | 3 | ethyl | H | H | H | Z-3 | 100 |
| 27 | isobutyl | 4 | 3 | H | 3 | ethyl | H | H | H | Z-1, Z-2 | 50 |
| 28 | isobutyl | 4 | 3 | H | 3 | H | H | methyl | H | Z-1, Z-2 | 60 |
| 29 | isobutyl | 4 | 5 | H | 5 | H | H | methyl | H | Z-1, Z-2 | 50 |
| 30 | tert-butyl | 4 | 3 | H | 5 | H | H | methyl | H | Z-1, Z-2 | 50 |
| 31 | tert-butyl | 4 | 10 | H | 5 | H | H | methyl | H | Z-1, Z-2 | 30 |
| 32 | tert-butyl | 4 | 3 | H | 3 | H | H | methyl | H | Z-1, Z-2 | 50 |
| 33 | tert-butyl | 4 | 2 | H | 2 | H | H | methyl | H | Z-3 | 100 |
| 34 | n-pentil | 5 | 3 | H | 3 | H | H | methyl | H | Z-1, Z-2 | 50 |
| 35 | n-pentil | 5 | 1 | H | 2 | H | H | methyl | H | Z-1, Z-2 | 50 |
| 36 | n-pentil | 5 | 4 | H | 4 | H | H | methyl | H | Z-1, Z-2 | 60 |
| 37 | isopentil | 5 | 4 | H | 4 | H | H | methyl | H | Z-3 | 100 |
| 38 | isopentil | 5 | 4 | H | 4 | H | H | methyl | H | Z-1, Z-2 | 40 |
| 39 | isopentil | 5 | 8 | H | 8 | H | H | methyl | H | Z-1, Z-2 | 50 |
| 40 | isopentil | 5 | 2 | H | 2 | H | H | methyl | H | Z-1, Z-2 | 50 |
| 41 | n-hexyl | 6 | 2.5 | H | 2.5 | H | H | methyl | H | Z-1, Z-2 | 50 |
| 42 | n-hexyl | 6 | 3 | H | 3 | H | H | methyl | H | Z-1, Z-2 | 60 |
| 43 | n-hexyl | 6 | 3 | H | 1.5 | H | H | methyl | H | Z-1, Z-2 | 50 |
| 44 | n-hexyl | 6 | 5 | H | 5 | methyl | H | methyl | H | Z-1, Z-2 | 98 |
| 45 | n-hexyl | 6 | 3 | H | 1 | H | H | methyl | H | Z-1, Z-2 | 70 |
| 46 | n-hexyl | 6 | 1 | H | 1 | H | H | methyl | H | Z-1, Z-2 | 60 |
| 47 | n-hexyl | 6 | 1 | H | 3 | H | H | methyl | H | Z-1, Z-2 | 50 |
| 48 | n-hexyl | 6 | 2 | H | 1 | H | H | methyl | H | Z-3 | 100 |
| 49 | isohexyl | 6 | 3 | H | 3 | H | H | methyl | H | Z-1, Z-2 | 50 |
| 50 | isohexyl | 6 | 5 | H | 5 | H | H | methyl | H | Z-1, Z-2 | 50 |

TABLE III

| | | Ethylene Oxide Structure | | Alkylated Ethylene Oxide Structure | | | | | Z | |
|---|---|---|---|---|---|---|---|---|---|---|
| | $R^2$ | | | | | | | | | |
| Compound Example Number | Substituent | Number of Carbon Atoms | Average Number of Added Structures l | $R^{21}$~$R^{24}$ | Average Number of Added Structures m | $R^{21}$ | $R^{22}$ | $R^{23}$ | $R^{24}$ | Structure | Monoester Molar Ratio (%) |
| 51 | isohexyl | 6 | 2 | H | 2 | H | H | methyl | H | Z-1, Z-2 | 50 |
| 52 | n-octyl | 8 | 3 | H | 3 | H | H | methyl | H | Z-1, Z-2 | 40 |
| 53 | n-octyl | 8 | 2 | H | 2 | H | H | methyl | H | Z-1, Z-2 | 50 |
| 54 | n-octyl | 8 | 1 | H | 2 | H | H | methyl | H | Z-1, Z-2 | 50 |
| 55 | n-octyl | 8 | 5 | H | 5 | H | H | methyl | H | Z-1, Z-2 | 50 |
| 56 | n-octyl | 8 | 2 | H | 1 | H | H | methyl | H | Z-1, Z-2 | 60 |
| 57 | n-octyl | 8 | 1.5 | H | 1.5 | H | H | methyl | H | Z-1, Z-2 | 50 |
| 58 | 2-ethylhexyl | 8 | 3 | H | 3 | H | H | methyl | H | Z-1, Z-2 | 50 |
| 59 | 2-ethylhexyl | 8 | 2 | H | 2 | H | H | methyl | H | Z-1, Z-2 | 40 |
| 60 | 2-ethylhexyl | 8 | 2.5 | H | 2.5 | H | H | methyl | H | Z-1, Z-2 | 50 |
| 61 | 2-ethylhexyl | 8 | 1.5 | H | 1.5 | H | H | methyl | H | Z-1, Z-2 | 50 |
| 62 | 2-ethylhexyl | 8 | 5 | H | 7 | methyl | H | H | H | Z-1, Z-2 | 30 |
| 63 | 2-ethylhexyl | 8 | 2 | H | 2 | H | H | methyl | H | Z-3 | 100 |
| 64 | isooctyl | 8 | 2.5 | H | 2.5 | H | H | methyl | H | Z-1, Z-2 | 40 |
| 65 | isooctyl | 8 | 5 | H | 5 | methyl | H | methyl | H | Z-1, Z-2 | 18 |
| 66 | isooctyl | 8 | 1.2 | H | 1.8 | H | H | methyl | H | Z-1, Z-2 | 50 |
| 67 | isooctyl | 8 | 2 | H | 3 | H | H | methyl | H | Z-1, Z-2 | 50 |
| 68 | n-decyl | 10 | 1.5 | H | 1.5 | methyl | H | methyl | H | Z-1, Z-2 | 50 |
| 69 | n-decyl | 10 | 3 | H | 3 | H | H | methyl | H | Z-1, Z-2 | 50 |
| 70 | n-decyl | 10 | 1.5 | H | 1.5 | H | H | methyl | H | Z-1, Z-2 | 50 |
| 71 | n-decyl | 10 | 2 | H | 5 | methyl | methyl | H | H | Z-1, Z-2 | 95 |
| 72 | isodecyl | 10 | 5 | H | 5 | H | H | methyl | H | Z-1, Z-2 | 50 |
| 73 | isodecyl | 10 | 3 | H | 3 | H | H | methyl | H | Z-1, Z-2 | 50 |
| 74 | isodecyl | 10 | 2 | H | 2 | H | H | methyl | H | Z-1, Z-2 | 50 |
| 75 | n-dodecyl | 12 | 1.5 | H | 1.5 | H | H | methyl | H | Z-1, Z-2 | 50 |

TABLE III-continued

| Compound Example Number | R² Substituent | R² Number of Carbon Atoms | Ethylene Oxide Structure Average Number of Added Structures l | R²¹~R²⁴ | Alkylated Ethylene Oxide Structure Average Number of Added Structures m | R²¹ | R²² | R²³ | R²⁴ | Z Structure | Monoester Molar Ratio (%) |
|---|---|---|---|---|---|---|---|---|---|---|---|
| 76 | n-dodecyl | 12 | 2 | H | 2 | H | H | methyl | H | Z-1, Z-2 | 60 |
| 77 | n-dodecyl | 12 | 3 | H | 3 | H | H | methyl | H | Z-1, Z-2 | 50 |
| 78 | n-dcdecyl | 12 | 1.3 | H | 1.7 | H | H | methyl | H | Z-1, Z-2 | 60 |
| 79 | n-dodecyl | 12 | 2 | H | 2 | H | H | methyl | H | Z-1, Z-2 | 50 |
| 80 | n-dodecyl | 12 | 3 | H | 3 | H | H | methyl | H | Z-1, Z-2 | 50 |

TABLE IV

| Compound Example Number | R² Substituent | R² Number of Carbon Atoms | Ethylene Oxide Structure Average Number of Added Structures l | R²¹~R²⁴ | Alkylated Ethylene Oxide Structure Average Number of Added Structures m | R²¹ | R²² | R²³ | R²⁴ | Z Structure | Monoester Molar Ratio (%) |
|---|---|---|---|---|---|---|---|---|---|---|---|
| 81 | n-dodecyl | 12 | 2 | H | 2 | H | H | methyl | H | Z-1, Z-2 | 60 |
| 82 | 2-butyl octyl | 12 | 5 | H | 3 | H | H | methyl | H | Z-1, Z-2 | 50 |
| 83 | 2-butyl octyl | 12 | 1.5 | H | 1.5 | H | H | methyl | H | Z-1, Z-2 | 50 |
| 84 | 2-butyl octyl | 12 | 1.5 | H | 1.5 | H | methyl | H | H | Z-1, Z-2 | 60 |
| 85 | 2-butyl octyl | 12 | 1 | H | 3 | H | H | methyl | H | Z-1, Z-2 | 50 |
| 85 | 2-hexil Octil | 14 | 1 | H | 1.5 | H | H | methyl | H | Z-1, Z-2 | 30 |
| 87 | 2-hexil Octil | 14 | 2 | H | 3 | H | H | methyl | H | Z-1, Z-2 | 50 |
| 88 | n-pentadecyl | 15 | 1.5 | H | 1.5 | H | H | methyl | H | Z-1, Z-2 | 50 |
| 89 | n-pentadecyl | 15 | 3 | H | 2 | H | H | methyl | H | Z-1, Z-2 | 50 |
| 90 | n-stearyl | 16 | 3 | H | 3 | H | H | methyl | H | Z-1, Z-2 | 70 |
| 91 | n-stearyl | 16 | 1.5 | H | 2.5 | H | H | methyl | H | Z-1, Z-2 | 50 |
| 92 | n-stearyl | 16 | 3 | H | 3 | H | H | methyl | H | Z-3 | 100 |
| 93 | n-stearyl | 16 | 3 | H | 3 | H | H | methyl | H | Z-1, Z-2 | 50 |
| 94 | octadecyl | 18 | 1.5 | H | 1.5 | H | H | methyl | H | Z-1, Z-2 | 50 |
| 95 | phenyl | 6 | 5 | H | 5 | H | H | methyl | H | Z-1, Z-2 | 50 |
| 96 | phenyl | 6 | 3 | H | 3 | H | H | methyl | H | Z-1, Z-2 | 50 |
| 97 | phenyl | 12 | 1 | H | 1 | H | H | methyl | H | Z-1, Z-2 | 50 |
| 98 | xylyl | 12 | 3 | H | 4 | H | H | methyl | H | Z-1, Z-2 | 50 |

Hereinafter, some of compound examples listed in Tables will be specifically described.

Compound Example 1

Compound Example 1 is a mixture of:
a compound in which "Z" is (Z-1) (diester); and
a compound in which "Z" is (Z-2) (monoester).
A compound in which "Z" is (Z-2) (monoester) is represented by, for example, a structure of Compound Example 1-1 below. A compound in which "Z" is (Z-1) (diester) is represented by, for example, a structure of Compound Example 1-2 below.

Compound Example 1-1

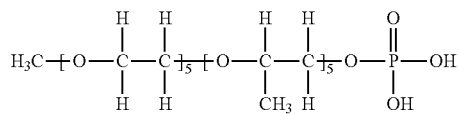

Compound Example 1-2

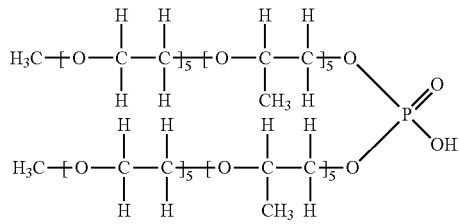

In Compound Example 1, a molar ratio of a compound in which "Z" is (Z-2) (monoester) is 50%. The same molar amounts of above-mentioned Compound Example 1-1 and Compound Example 1-2 are contained.

The "l" and "m" are average numbers of added structures. Compound Example 1 having "l" of five and "m" of five does not necessarily have five ethylene oxide structures and five alkylated ethylene oxide structures in one molecule.

Compound Example 6

Compound Example 6 in which "Z" is (Z-3) is represented by, for example, Compound Example 6-1 below Compound Example 6-1

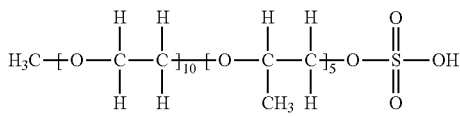

The "l" and "m" are average numbers of added structures. Compound Example 6 having "l" of ten and "m" of five does not necessarily have ten ethylene oxide structures and five alkylated ethylene oxide structures in one molecule.

In the present invention, order of the ethylene oxide structures and the alkylated ethylene oxide structures is not limited. The compounds of the present invention also include compounds in which the structures are randomly arranged. Order of the ethylene oxide structures and the alkylated ethylene oxide structures can be changed to any order by changing a synthesis method. For example, following Compound Example 6-2 is also included in Compound Example 6.

Compound Example 6-2

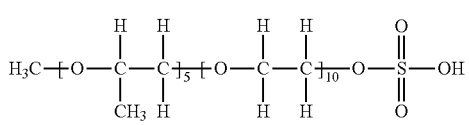

Method of Synthesizing Second Compound

The second compound according to the present invention can be synthesized with reference to known methods described in, for example, JP2005-255608A, JP2015-000396A, JP2015-000970A, JP2015-178072A, JP2015-178073A, Japanese Patent No. 4422866.

Hereinafter, some of methods of synthesizing compound examples listed in Tables will be specifically described. The method of synthesizing the second compound according to the present invention is not limited to the following synthesis methods.

Method of Synthesizing Compound Example 53

130 g (1.0 mol) of n-octanol is put in an autoclave. 116 g (2.0 mol) of propylene oxide is added under a condition of a pressure of 147 kPa and a temperature of 130° C. Potassium hydroxide is used as a catalyst. Then, 88 g (2.0 mol) of ethylene oxide is added.

Next, it is confirmed that no n-octanol remains. The adduct is put in an reactor. 47 g (0.33 mol) of anhydrous phosphoric acid is reacted in a toluene solution at 80° C. for 5 hours. It is washed with distilled water. The solvent is distilled off under reduced pressure. Thus, Compound Example 53 shown below is obtained.

Compound Example 53

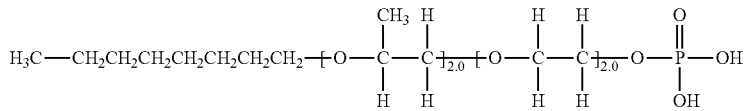

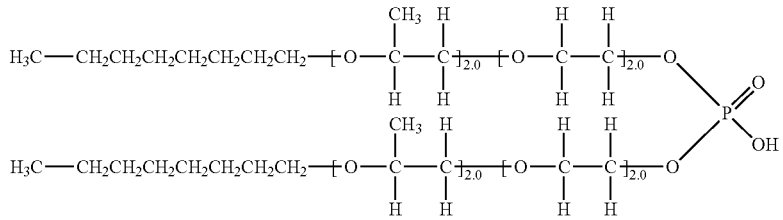

Method of Synthesizing Compound Example 54

130 g (1.0 mol) of n-octanol is put in an autoclave. 116 g (2.0 mol) of propylene oxide is added under a condition of a pressure of 147 kPa and a temperature of 130° C. Potassium hydroxide is used as a catalyst. Then, 44 g (1.0 mol) of ethylene oxide is added.

Next, it is confirmed that no n-octanol remains. The adduct is put in an reactor. 47 g (0.33 mol) of anhydrous phosphoric acid is reacted in a toluene solution at 80° C. for 5 hours. It is washed with distilled water. The solvent is distilled off under reduced pressure. Thus, Compound Example 54 shown below is obtained.

Compound Example 54

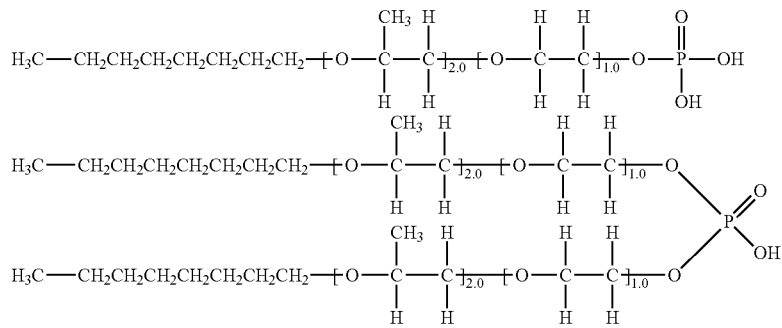

Method of Synthesizing Compound Example 60

130 g (1.0 mol) of 2-ethylhexanol is put in an autoclave. 145 g (2.5 mol) of propylene oxide is added under the condition of the pressure of 147 kPa and the temperature of 130° C. Potassium hydroxide is used as a catalyst. Then, 110 g (2.5 mol) of ethylene oxide is added.

Next, it is confirmed that no 2-ethylhexanol remains. The adduct is put in an reactor 47 g (0.33 mol) of anhydrous phosphoric acid is reacted in a toluene solution at 80° C. for 5 hours. It is washed with distilled water. The solvent is distilled off under reduced pressure. Thus, Compound Example 60 shown below is obtained.

Compound Example 60

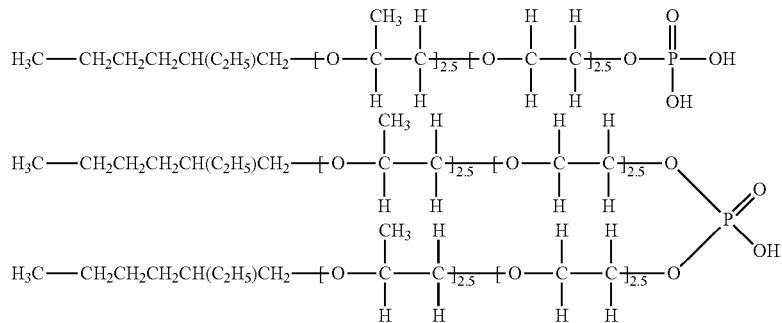

Method of Synthesizing Compound Example 61

130 g (1.0 mol) of 2-ethylhexanol is put in an autoclave. 87 g (1.5 mol) of propylene oxide is added under the condition of the pressure of 147 kPa and the temperature of 130° C. Potassium hydroxide is used as a catalyst. Then, 66 g (1.5 mol) of ethylene oxide is added.

Next, it is confirmed that no 2-ethylhexanol remains. The adduct is put in an reactor. 47 g (0.33 mol) of anhydrous phosphoric acid is reacted in a toluene solution at 80° C. for 5 hours. It is washed with distilled water. The solvent is distilled off under reduced pressure Thus, Compound Example 61 shown below is obtained.

Compound Example 61

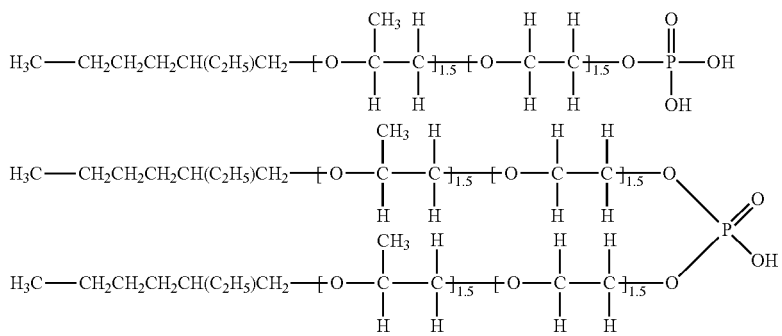

Copper Ingredient

The near infrared absorber according to the present invention contains at least one of:
Ingredient (A) containing a copper ion; and
Ingredient (B) containing a copper complex.

Therefore, the near infrared absorber contains at least one of a copper ion and a copper complex.

Copper Ion

A copper ion contained in the near infrared absorber according to the present invention is a divalent copper ion and may be solvated.

Copper Complex

Ingredient (B) contained in the near infrared absorber according to the present invention is:
the copper complex in which the first compound is coordinated; and
the copper complex in which the second compound is coordinated.

The near infrared absorber according to the present invention may have a copper complex in which another compound is coordinated (for example, copper acetate).

Copper Complex in which First Compound is Coordinated

In the copper complex in which the first compound is coordinated (copper phosphonate complex), at least one first compound is coordinated. The copper complex may contain other compounds coordinated together.

A structure of the copper complex in which the first compound (copper phosphonate complex) is coordinated is represented by, for example, following General Formula (IC).

General Formula (IC)

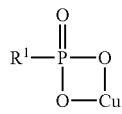

In the near infrared absorbing composition of the present invention, the copper complex in which the first compound is coordinated (copper phosphonate complex) is mainly in a state of fine particles.

In the description, among hydroxy groups contained in the first compound, a hydroxy group directly bonded to a phosphorus atom is also referred to as a "reactive hydroxy group".

In the copper complex having the structure represented by General Formula (IC), both of two reactive hydroxy groups contained in the first compound are formed by reacting with one copper ion. A form of the copper complex according to the present invention in which the first compound is coordinated is not limited to that.

Copper Complex in which Second Compound is Coordinated

In the copper complex in which the second compound is coordinated (phosphate ester copper complex or sulfate ester copper complex), at least one second compound is coordinated. The copper complex may contain other compounds coordinated together.

In the near infrared absorbing composition of the present invention, the copper complex in which the second compound is coordinated (phosphate ester copper complex or sulfate ester copper complex) is mainly in a state of fine particles or a solution.

In the description, among the hydroxy groups contained in the second compound, a hydroxy group directly bonded to a phosphorus atom or a sulfur atom is also referred to as a "reactive hydroxy group".

In the copper complex in which the second compound is coordinated, two reactive hydroxy groups contained in the second compound may not be formed by reacting with one copper ion.

Average Particle Size of Copper Complex Fine Particles

In the near infrared absorbing composition of the present invention, it is good for spectral characteristics that the copper complex fine particles are uniformly dispersed in a near infrared absorbing film described later. Therefore, a particle size of the copper complex fine particles in a near infrared absorbing dispersion is preferably small.

An average particle size of the copper complex fine particles in the near infrared absorbing dispersion is preferably 200 nm or less, more preferably 100 nm or less, and even more preferably 80 nm or less.

An average particle size of the copper complex fine particles in the near infrared absorbing dispersion can be measured in a dynamic light scattering method using a zeta potential/particle size measurement system ELSZ-1000ZS by Otsuka Electronics Co., Ltd.

Content of Ingredients

A molar ratio CA/CE of the near infrared absorber according to the present invention is in the range of 2.5-50. CA is a molar content of the first compound. CE is the molar content of the second compound. For near infrared absorption, moisture resistance and heat resistance, the molar ratio CA/CE is preferably in a range of 3.8-10.

A high proportion of copper phosphonate complex, which is effective for near infrared absorption, improves near infrared absorption. A small proportion of an ester compound, which causes cloudiness in a hot and humid environment, improves moisture resistance and heat resistance. For these reasons, the molar ratio CA/CE is preferably 2.5 or more, more preferably 3.8 or more.

A certain amount of phosphate ester compound or sulfate ester compound is required to maintain dispersibility of the complex fine particles. Therefore, the molar ratio CA/CE is preferably 50 or less, more preferably 10 or less.

A molar ratio CH/CC of the near infrared absorber according to the present invention is in the range of 1.5-2.5. CC is a molar content of copper that constitutes a copper ion or a copper compound.

CH is a molar content of reactive hydroxy groups contained in the first compound and the second compound.

The molar ratio CH/CC within the range realizes spectral transmission characteristics that:
visible light transmittance in a wavelength range of 400-700 nm is high;
transmitted light does not leak near 1100 nm in the near infrared region;
absorption performance is maintained efficiently; and
some absorption characteristics is kept even at 700 nm, which is an end of the long wavelength of visible light.

The first compound in CA is not limited to the first compound itself, which is used as a raw material. It includes those that have reacted with other ingredients. For example, it includes those in which a copper complex is formed by reacting with a copper ion. Therefore, the content CA is not the number of compounds but the number of "portions that had the structure represented by General Formula (I)" in the copper complex.

The second compound in CE is not limited to the compound itself having the structure represented by General Formula (II), which is used as a raw material. It includes those that have reacted with other ingredients. For example, it includes those in which a copper complex is formed by reacting with a copper ion. Therefore, the content CE is not the number of compounds but the number of "portions that had the structure represented by General Formula (II)" in the copper complex.

The "copper that constitutes a copper ion or a copper compound" in CC is copper for each atom that constitutes a copper ion or a copper compound.

The "reactive hydroxy group contained in the first compound and the second compound" in CH is a hydroxy group directly bonded to a phosphorus atom or a sulfur atom among the hydroxy groups contained in the first compound and the second compound.

It includes those in winch the hydroxy group reacts with other ingredients, such as one in which hydrogen is liberated and oxygen is coordinated to a copper ion.

(1.2) Organic Dye

To adjust an absorption wavelength, the near infrared absorbing composition of the present invention preferably contains an organic dye. Organic dyes that can be used are, for example, cyanine dye, squarylium dye, croconium dye, azo dye, anthraquinone dye, naphthoquinone dye, phthalocyanine dye, naphthalocyanine dye, quaterylene dye, and dithiol metal complex dye. For sufficient near infrared absorption, high visible light transmittance, and high heat resistance, the organic dye is preferably a quaterylene derivative, a phthalocyanine derivative, a cyanine derivative or a squarylium derivative.

The quaterylene derivative is, for example, a compound described in JP 2008-009206A and JP 2011-225608A. The quaterylene derivative can be synthesized in the methods described in these publications.

The phthalocyanine derivative is a compound described in, for example, JP 2000-26748A, JP 2000-63691A, JP 2001-106689A, JP 2004-149752A, JP 2004-18561A. JP 2005-220060A. JP 2007-169343A. JP 2016-204536A, and JP 2016-218167A. The phthalocyanine derivative can be synthesized in the methods described in these publications.

Organic dyes that can be used in the present invention are commercially available. Trade names are, for example, FDR002, FDR003, FDR004, FDR005, FDN001 (Yamada Chemical Industry Co., Ltd.). ExcolorTX-EX720. Excolor TX-EX708K (Nippon Shokubai Co., Ltd.), Lumogen IR765, Lumogen IR788 (BASF). ABS694. IRA735, IRA742. IRA751, IRA764, IRA788, IRA800 (Exciton), epolight5548, epolight5768 (Ako Co., Ltd.), VIS680E. VIS695A, NIR700B, NIR735B, NIR757A, NIR762A, NIR775B, NIR778A. NIR783C, NIR783I, NIR790B, NIR795A (QCR solutions Co., Ltd.), DLS740A, DLS740B. DLS740C, DLS744A, DLS745B. DLS771A, DLS774A, DLS774B, DLS775A, DLS775B, DLS780A. DLS780C, DLS782F (Crystalin Co., Ltd.), B4360, B4361, D4773, and D5013 (Tokyo Chemical Industry Co., Ltd.).

For spectral characteristics, the organic dye contained in the near infrared absorbing composition of the present invention preferably has an absorption maximum wavelength in a wavelength range of 650-800 nm.

A content of the organic dye is preferably in a range of 0.01-1.0% by mass with respect to 100% by mass of the near infrared absorber constituting the near infrared absorbing composition.

In a case where the content of the organic dye is 0.01% by mass or more with respect to 100% by mass of the near infrared absorber, near infrared absorption is sufficiently enhanced. In a case where the content of the organic dye is 1.0% by mass or less, visible light transmittance of the obtained near infrared absorbing composition is not impaired.

(1.3) Ultraviolet Absorber

For spectral characteristics and light resistance, the near infrared absorbing composition of the present invention preferably contains an ultraviolet absorber.

The ultraviolet absorber is not limited, and is, for example, a benzotriazole-based ultraviolet absorber, a benzophenone-based ultraviolet absorber, a salicylate ester-based ultraviolet absorber, a cyanoacrylate-based ultraviolet absorber, or a triazine-based ultraviolet absorber.

The benzotriazole-based ultraviolet absorber is, for example, 5-chloro-2-(3,5-di-sec-butyl-2-hydroxylphenyl)-2H-benzotriazole, or (2-2H-benzotriazole-2-yl)-6-(straight chain and side chain dodecyl)-4-methylphenol. The benzotriazole-based ultraviolet absorber is commercially available, and is, for example, the TINUVIN series such as TINUVIN109, TINUVIN171, TINUVIN234, TINUVIN326, TINUVIN327, TINUVIN328, and TINUVIN928. All of them are commercially available products manufactured by BASF.

The benzophenone-based ultraviolet absorber is, for example, 2-hydroxy-4-benzyloxybenzophenone, 2,4-benzyloxybenzophenone, 2,2'-dihydroxy-4-methoxybenzophenone, 2-hydroxy-4-methoxy-5-sulfobenzophenone, or bis(2-methoxy-4-hydroxy-S-benzoylphenylmethane).

The salicylic acid ester-based ultraviolet absorber is, for example, phenyl salicylate or p-tert-butyl salicylate.

The cyanoacrylate-based ultraviolet absorber is, for example, 2'-ethylhexyl-2-cyano-3,3-diphenylacrylate, or ethyl-2-cyano-3-(3',4'-methylenedioxyphenyl)-acrylate.

The triazine-based ultraviolet absorber is, for example, 2-(2'-hydroxy-4'-hexyloxyphenyl)-4,6-diphenyltriazine. A commercially available product of the triazine-based ultraviolet absorber is, for example, TINUVIN477 (BASF).

A content of the ultraviolet absorber is preferably in a range of 0.1-5.0% by mass with respect to 100% by mass of the near infrared absorber constituting the near infrared absorbing composition.

In a case where the content of the ultraviolet absorber is 0.1% by mass or more with respect to 100% by mass of the near infrared absorber, the light resistance is sufficiently enhanced. In a case where the content of the ultraviolet absorber is 5.0% by mass or less, the visible light transmittance of the obtained near infrared absorbing composition is not impaired.

(1.4) Form and Manufacturing Method of Near Infrared Absorbing Composition

The near infrared absorbing composition of the present invention may be in a state of a dispersion in which ingredients such as the near infrared absorber are dispersed in a solvent. Hereinafter, the near infrared absorbing composition in this state is also referred to as a near infrared absorbing dispersion.

The near infrared absorbing composition may be in a state of a film cured together with a curable resin. Hereinafter, the near infrared absorbing composition in this state is also referred to as a near infrared absorbing film.

Manufacturing Method of Near Infrared Absorbing Dispersion

At least the first compound, the second compound, and a compound serving as a copper ion source are added to a solvent and mixed. Thereby, the near infrared absorbing dispersion is produced.

Additives such as organic dyes and ultraviolet absorbers may be added depending on intended products.

Ingredients are added so as to be within the above-mentioned content rate range.

Solvent

The solvent that can be used in the present invention is not limited, and is, for example, a hydrocarbon solvent, more preferably an aliphatic hydrocarbon solvent, an aromatic hydrocarbon solvent, or a halogen solvent.

The aliphatic hydrocarbon solvent is, for example, a non-cyclic aliphatic hydrocarbon solvent such as hexane and heptane, a cyclic aliphatic hydrocarbon solvent such as cyclohexane, an alcohol solvent such as methanol, ethanol, n-propanol and ethylene glycol, a ketone solvent such as acetone and methyl ethyl ketone, or an ether solvent such as diethyl ether, diisopropyl ether, tetrahydrofuran, 1,4-dioxane and ethylene glycol mononethyl ether. The aromatic hydrocarbon solvent is, for example, toluene, xylene, mesitylene, cyclohexylbenzene, or isopropylbiphenyl. The halogen-based solvent is, for example, methylene chloride, 1,1,2-trichloroethane, or chloroform. Further, the halogen-based solvent may be, for example, anisole, 2-ethylhexane, sec-butyl ether, 2-pentanol, 2-metlyltetrahydrofuran, 2-propylene glycol monomethyl ether, 2,3-dimethyl-1,4-dioxane, sec-butylbenzene, or 2-methylcyclohexylbenzene. Toluene and tetrahydrofuran are preferred because of their boiling point and solubility.

A ratio of a solid content (ingredients other than the solvent) to the entire near infrared absorbing dispersion is preferably in a range of 5-30% by mass. It makes a concentration of solids (such as copper complex microparticles) appropriate and suppresses particle cohesion during storage. More excellent stability over time (dispersion stability and near infrared absorption of copper complex fine particles) is obtained. The ratio is more preferably in a range of 10-20% by mass.

First Compound

The first compound (phosphonic acid compound) to be added may be a commercially available product.

Second Compound

As the second compound (phosphate ester compound or sulfuric acid ester compound) to be added, the compound obtained by the above-mentioned synthesis method can be used.

Compound that Serve as Copper Ion Source

A copper salt capable of supplying divalent copper ions is used as a compound serving as a copper ion source to be added. For example, a copper salt of organic acid or a copper salt of inorganic acid is used.

The copper salt is, for example:

copper salt of organic acid, such as anhydrous copper acetate, anhydrous copper formate, anhydrous copper stearate, anhydrous copper benzoate, anhydrous copper acetoacetate, anhydrous ethyl acetoacetate, anhydrous copper methacrylate, anhydrous copper pyrophosphate, anhydrous copper naphthenate, anhydrous copper citrate, etc., or hydrate of the copper salt of organic acid;

a copper salt of inorganic acid such as copper oxide, copper chloride, copper sulfate, copper nitrate, copper phosphate, basic copper sulfate, basic copper carbonate, etc., or hydrate of the copper salt of inorganic acid; or copper hydroxide.

Other Additives

An organic dye and an ultraviolet absorber described above may be used.

Method of Manufacturing Near Infrared Absorbing Film

The near infrared absorbing film is made by:

preparing a coating liquid for forming a near infrared absorbing film by dissolving a matrix resin in the above-mentioned near infrared absorbing dispersion;

applying the liquid for forming a near infrared absorbing film onto a substrate in a wet application method by spin coating or a dispenser; and curing the coating film by predetermined heat treatment.

Coating may be applied to a transparent dielectric substrate. In that case, the near infrared absorbing film is formed directly on the transparent dielectric substrate as a near infrared absorbing layer. A near infrared cut filter described later is easily made.

A film thickness of the near infrared absorbing film of the present invention is preferably in a range of 10-150 μm, and more preferably in a range of 10-100 μm.

A film thickness of the near infrared absorbing film is measured, for example, with a film thickness meter which is a combination of the following.

Terminal—DIGIMICRO MH-ISM (Nikon)
Stand—DIGIMICRO STAND MS-5C (Nikon)
Reader—DIGITAL READ OUT TC-101A (Nikon)

Matrix Resin

Preferably, a matrix resin (also referred to as a binder resin) used for forming the near infrared absorbing film is a curable resin. Preferably, it has light transmission for visible light and near infrared rays, and can disperse fine particles of the near infrared absorbing composition. The copper phosphonate complex is a substance with relatively low polarity and disperses well in hydrophobic materials Therefore, as a matrix resin for forming the near infrared absorbing film, a resin having a polysiloxane structure (silicone) or a resin having an acrylic group, an epoxy group, or a phenyl group is preferably used.

The resin having the polysiloxane structure is preferable because it is not likely to thermally decompose;
it has high light transmission for visible light and near infrared rays; and
it has high heat resistance.

Resins having the polysiloxane structure are, for example, KR-255. KR-300, KR-2621-1, KR-211, KR-311, KR-216, KR-212, and KR-251 by Shin-Etsu Chemical Co., Ltd., and SS-6203, SS-6309. VS-9301, and VS-9506 by Sanyulek.

For low gas permeability and moisture resistance, a matrix resin having an epoxy group is preferably used. Resins having the epoxy group are, for example, KJC-X5 (Shin-Etsu Chemical Co., Ltd.), NLD-L-672 (Sanyulek). LE-1421 (Sanyulek), and EpiFine series (KISCO).

A matrix resin of the near infrared absorbing film is preferably a resin having both the polysiloxane structure and the epoxy group mentioned above.

The matrix resin having both the polysiloxane structure and the epoxy group has high heat resistance and moisture resistance, and thus has properties suitable as a material for a solid state image sensor. Resins having both the polysiloxane structure and the epoxy group are, for example, EpiFine series (KISCO) and ILLUMIKA series (Kaneka).

Other Additives

Other additives can be applied to the near infrared absorbing film of the present invention as long as the object and effect of the present invention is achieved. Other additives are, for example, a sensitizer, a cross-linking agent, a curing accelerator, a filler, a thermosetting accelerator, a thermal polymerization inhibitor, and a plasticizer. An adhesion promoter to a surface of a substrate and other auxiliaries (such as conductive particles, a filler, a defoamer, a flame retardant, a leveling agent, a peeling accelerator, an antioxidant, a fragrance, a surface tension adjustment, and a chain transfer agent) may be used in combination.

Properties such as stability and physical properties of the target near infrared absorbing film can be adjusted by appropriately containing these ingredients.

For example, paragraphs from [0183] of JP 2012-003225A, paragraphs [0101]-[0102], [0103]-[0104] and [0107]-[0109] of JP2008-250074A can be used as a reference for those ingredients.

(1.5) Spectral Characteristics

Spectral Transmittance of Near Infrared Absorbing Dispersion

For visible light transmittance, an average spectral transmittance of the near infrared absorbing composition of the present invention in a state of a near infrared absorbing dispersion in the wavelength region of 450-600 nm is preferably 70% or more, more preferably 80/u or more, and even more preferably 90% or more. Measurement is carried out in a state where the near infrared absorbing composition is diluted with a solvent such that the maximum spectral transmittance at the wavelength of 850-1,000 nm is 10%.

A measuring device for spectral transmittance is, for example, a spectrophotometer V-570 by JASCO Corporation.

Spectral Characteristics of Near Infrared Absorbing Film

Average Spectral Transmittance

For visible light transmittance, an average spectral transmittance of the near infrared absorbing composition of the present invention in a state of the near infrared absorbing film is preferably 80% or more in the wavelength range of 450-600 nm.

For near infrared absorption, an average spectral transmittance is preferably 10% or less in the wavelength range of 850-1,000 nm.

For near infrared absorption, the average spectral transmittance is preferably 1% or less in a wavelength range of 750-1,080 nm.

Cutoff Wavelength

In the wavelength range of 600-700 nm, a spectral transmittance decreases as a wavelength increases. A cutoff wavelength is a wavelength in which a spectral transmittance is 50% in the wavelength range of 600-700 nm. For near infrared absorption, a cutoff wavelength of the near infrared absorbing composition of the present invention in the state of the near infrared absorbing film with respect to light incident on a surface at an incident angle of 0° is preferably within a range of 600-680 un.

A spectral transmittance in the state of the near infrared absorbing film can also be measured with the spectrophotometer V-570 by JASCO Corporation.

(1.6) Applications of Near-Infrared Absorbing Composition

The near infrared absorbing film (near infrared absorbing composition in a state of a film cured together with a curable resin) of the present invention is suitable for, for example, a visibility correction member for a CCD, a CMOS, or other light receiving elements, a photometric member, a heat my absorbing member, a composite optical filter, a lens member (glasses, sunglasses, goggles, optical system, optical waveguide system), a fiber member (optical fiber), a noise cutting member, a display cover or a display filter such as a plasma display front plate, a projector front plate, a light source heat ray cut member, a color tone correction member, an illumination brightness adjustment member, an optical element (such as an optical amplification element and a wavelength conversion element), an optical communication function device such as a Faraday element and an isolator, and an optical disk element.

(2) Near Infrared Cut Filter

A near infrared cut filter of the present invention includes a near infrared absorbing layer on at least one side of a transparent dielectric substrate. The near infrared absorbing layer contains the near infrared absorbing composition of the present invention.

Preferably, the near infrared cut filter further comprises a dielectric multilayer film on at least one side of the transparent dielectric substrate. It allows more free adjustment of spectral characteristics of the near infrared cut filter.

The near infrared absorbing layer and the dielectric multilayer film may be provided in contact with the transparent dielectric substrate, or may be provided via another intermediate layer.

FIG. 1 is a schematic cross-sectional view showing an example of the near infrared cut filter of the present invention.

The near infrared cut filter 9 in FIG. 1 includes a near infrared absorbing layer 22 on one side of the transparent dielectric substrate 21, and a dielectric multilayer film 23 on the other side.

A material of the transparent dielectric substrate is not limited as long as the object of the present invention is achieved. For example, the substrate may be made of glass, or may be made of an optical resin such as polycarbonate (PC), polymethylmethacrylate (PMMA), cycloolefin polymer (COP), or silicone.

A thickness of the transparent dielectric substrate is preferably 0.01-1 mm.

Since the transparent dielectric substrate needs to transmit visible light, an average spectral transmittance in the wavelength range of 450-600 nm is preferably 80% or more.

The near infrared absorbing film of the present invention can be applied to the near infrared absorbing layer. As described above, the near infrared absorbing film as the near infrared absorbing layer is directly formed on the transparent dielectric substrate to make the near infrared cut filter.

The dielectric multilayer film is formed by layering a plurality of layers made of materials having different refractive indexes. The dielectric multilayer film is used to control a transmittance of each wavelength of light. A spectral characteristics of the near infrared cut filter can be adjusted more freely by including both the dielectric multilayer film and the near infrared absorbing layer.

The spectral characteristics of the dielectric multilayer film can be adjusted by changing a thickness and a material type of each layer. For example, dielectrics such as titanium oxide, silicon oxide, aluminum oxide, zirconium oxide, tantalum pentoxide, niobium pentoxide, lanthanum oxide, yttrium oxide, zinc oxide, zinc sulfide, indium oxide, silica, alumina, lanthanum oxide, magnesium fluoride, sodium aluminum hexafluoride can be used as a material for each layer.

The near infrared cut filter provided with a dielectric multilayer can be made by being layered on a transparent dielectric substrate in the vacuum vapor deposition method, the chemical vapor deposition (CVD) method, the sputtering method, or the like. The filter can also be made by adhering a separately prepared dielectric multilayer film to a transparent dielectric substrate with an adhesive.

(3) Solid State Image Sensor

The solid state image sensor of the present invention includes the near infrared cut filter of the present invention.

The solid state image sensor is a member mainly consisting of a solid state image sensor substrate including a light-receiving element.

As long as the solid state image sensor of the present invention includes the near infrared cut filter of the present invention, other members can be any. For example, the sensor may include a flattening layer and a glass substrate.

Figure 2:
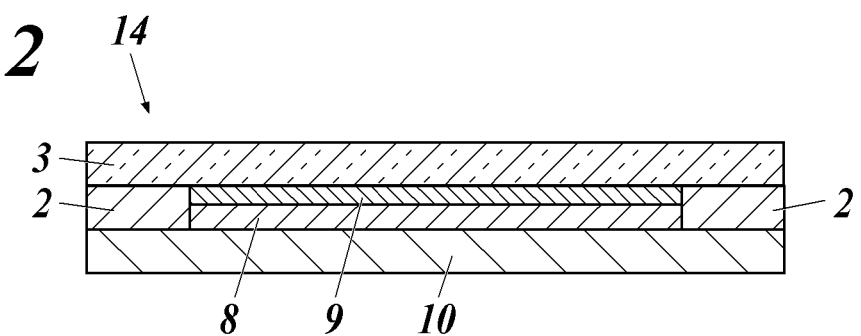
FIG. 2 is a schematic cross-sectional view showing an example of configuration of a solid state image sensor.

FIG. 2 is a schematic cross-sectional view showing an example of the solid state image sensor of the present invention.

The solid state image sensor 14 in FIG. 2 includes:
a solid state image sensor substrate 10 having a light-receiving element on a light-receiving side of a silicone substrate;
a flattening layer 8 provided on the solid state image sensor substrate 10;
a near infrared cut filter 9 provided on the flattening layer 8; and
a glass substrate 3 (light transmissive substrate) put on the near infrared cut filter 9.

They are adhered with an adhesive 2.

(4) Camera Module

The camera module of the present invention includes the solid state image sensor of the present invention.

As long as the camera module of the present invention includes the solid state image sensor of the present invention, other members and the like can be any. For example, the camera module is constituted by an imaging lens, a lens holder, a light-shielding and electromagnetic shield, and the like.

Figure 3:
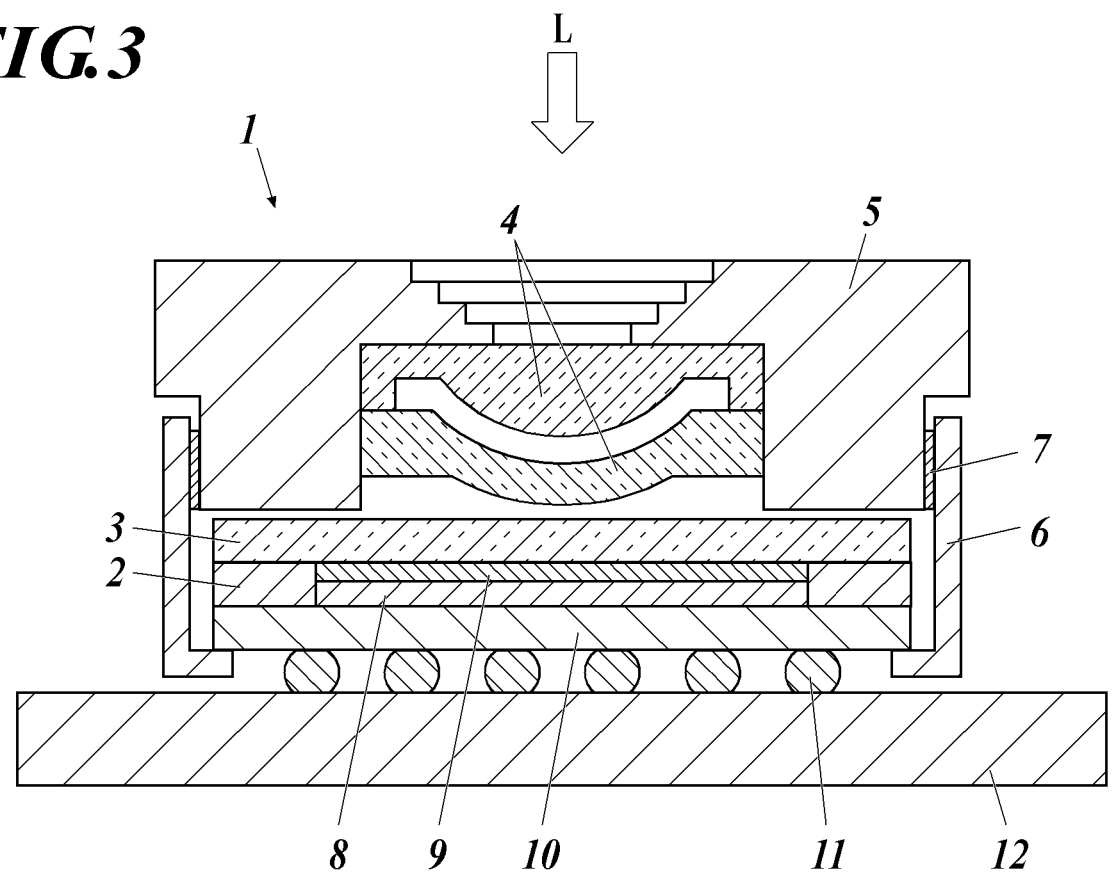
FIG. 3 is a schematic cross-sectional view showing an example of configuration of a camera module.

FIG. 3 is a schematic cross-sectional view showing an example of the camera module of the present invention.

The camera module 1 in FIG. 3 includes:
the solid state image sensor (the solid state image sensor substrate 10, the flattening layer 8, the near infrared cut filter 9, and the glass substrate 3);
a lens holder 5 put on the solid state image sensor and having an imaging lens 4 in an internal space; and
a light-shielding and electromagnetic shield 6 surrounding the solid state image sensor.

They are adhered with an adhesive 7.

The camera module 1 is connected to a circuit board 12 which is a mounting board via a solder ball 11 (connecting material) which is a connecting member.

In the camera module 1, incident light L from the outside passes through the imaging lens 4, the glass substrate 3, the infrared cut filter 9, and the flattening layer 8 in this order, and then reaches the light receiving element of the solid state image sensor substrate 10.

EXAMPLES

Hereinafter, the present invention will be specifically described with reference to examples. The present invention is not limited to this. In the examples, "parts" and "%" represents "parts by mass" and "% by mass" unless otherwise specified.

Example 1

Preparation of Near Infrared Absorbing Compositions (Dispersions)
Preparation of Near Infrared Absorbing Composition (Dispersion) 1

2.00 g (CC=10 mmol) of copper (II) acetate monohydrate (Kanto Chemical Co., Inc.) (hereinafter simply referred to as "copper acetate") and 82 g of tetrahydrofuran (THF) were mixed and stirred for 3 hours. Insoluble materials were removed by filtering this liquid. Thus, a copper acetate solution was prepared.

1.73 g (CE=2.8 mmol) of Compound Example 76 having a structure represented by General Formula (II) was dissolved in 7 g of THF. A synthesized compound was used as Compound Example 76.

The THF solution was added to the copper acetate solution and stirred at room temperature for 30 minutes. Thus Solution A was prepared.

0.78 g (CA=7.1 mmol) of Ethylphosphonic acid (Tokyo Chemical Industry Co. Ltd.), which is the first compound, was dissolved in 7 g of THF. Thus Solution B was prepared.

Solution B was added to Solution A while stirring Solution A, and the mixture was stirred at room temperature for 16 hours. Thus. Solution C (CH=18.7 mmol) was prepared.

Solution C and 30 g of toluene were put in a flask. While heating at 50-100° C. in an oil bath (OSB-2100 by Tokyo Rika Kikai Co., Ltd.), desolvating and diacetic acid treatment were performed for 30 minutes by a rotary evaporator (N-1000 by Tokyo Rika Kikai Co., Ltd.).

Then, an amount of a solvent was adjusted such that a solid content concentration of Solution C in the flask was 10% by mass. This is the near infrared absorbing composition (dispersion) 1.

CH was calculated as follows.

A molar content of a reactive hydroxy group contained in the first compound was 7.1 mmol×2, that is, 14.2 mmol.

A molar content of a reactive hydroxy group contained in the second compound was (2.8 mmol×60%×2)+(2.8 mmol×40%×1), that is, 4.5 mmol.

Therefore, CH, which is a total molar content of the reactive hydroxy group contained in the first compound and the second compound, was 14.2 mmol+4.5 mmol, that is, 18.7 mmol.

Preparation of Near Infrared Absorbing Compositions (Dispersions) 2-43

Types and addition amounts (mmol) of phosphonic acid compounds represented by General Formula (I) and types and addition amounts (mmol) of phosphate ester compounds or sulfate ester compounds represented by General Formula (II) were changed to those in Table V. Other than that, they were prepared in the same manner as the preparation of the near infrared absorbing composition (dispersion) 1. Thus, the near infrared absorbing compositions (dispersions) 2-43 were prepared.

Compound examples used as phosphate ester compounds or sulfate ester compounds represented by General Formula (II) were compound examples in Tables I-IV. Synthesized compounds were used.

Comparison Compound A was Prysurf A208F (Daiichi Kogyo Co., Ltd.).

Comparison Compound A is a phosphate ester compound. In General Formula (II), $R^7$ is an alkyl group containing eight carbons. The average number "1" of added ethylene oxide structures was three. The average number "n" of added alkylated ethylene oxide structures was zero.

Comparison Compound B was a synthesized compound.

Comparison Compound B was a phosphate ester compound. In General Formula (II). $R^2$ is an n-octyl group. The average number "1" of added ethylene oxide structures was zero. The average number "m" of added alkylated ethylene oxide structures was three. Z is (Z-1) and (Z-2). A molar ratio of monoester (Z-2) was 50%.

Configurations of the near infrared absorbing compositions (dispersions) 1-43 prepared above are shown in Table V below.

TABLE V

| Near Infrared Absorbing Composition | First Compound Having Structure Represented by General Formula (I) | | Second Compound Having Structure Represented by General Formula (II) | | Molar Ratio | | Note |
|---|---|---|---|---|---|---|---|
| | Type | CA(mmol) | Type | CE(mmol) | CA/CE | CH/CC | |
| 1 | ethyl phosphonic acid | 7.1 | *1_76 | 2.8 | 2.54 | 1.87 | invention |
| 2 | ethyl phosphonic acid | 8.2 | *1_76 | 2.0 | 4.10 | 1.96 | invention |
| 3 | ethyl phosphonic acid | 8.8 | *1_76 | 1.5 | 5.87 | 2.00 | invention |
| 4 | ethyl phosphonic acid | 9.8 | *1_76 | 0.3 | 32.67 | 2.01 | invention |
| 5 | ethyl phosphonic acid | 9.2 | *1_76 | 1.0 | 9.20 | 2.00 | invention |
| 6 | ethyl phosphonic acid | 8.5 | *1_63 | 2.0 | 4.25 | 2.10 | invention |
| 7 | ethyl phosphonic acid | 8.5 | *1_57 | 2.0 | 4.25 | 2.00 | invention |
| 8 | ethyl phosphonic acid | 8.5 | *1_41 | 2.0 | 4.25 | 2.00 | invention |
| 9 | propylphosphonic acid | 7.1 | *1_84 | 2.8 | 2.54 | 1.87 | invention |
| 10 | propylphosphonic acid | 8.2 | *1_84 | 2.0 | 4.10 | 1.96 | invention |
| 11 | propylphosphonic acid | 8.8 | *1_84 | 1.6 | 5.50 | 2.02 | invention |
| 12 | propylphosphonic acid | 9.8 | *1_76 | 0.3 | 32.67 | 2.01 | invention |
| 13 | propylphosphonic acid | 9.2 | *1_76 | 1.0 | 9.20 | 2.00 | invention |
| 14 | propylphosphonic acid | 8.5 | *1_63 | 2.0 | 4.25 | 2.10 | invention |
| 15 | propylphosphonic acid | 8.5 | *1_57 | 2.0 | 4.25 | 2.00 | invention |
| 16 | propylphosphonic acid | 8.8 | *1_83 | 1.6 | 5.50 | 2.00 | invention |
| 17 | methylphosphonic acid | 8.5 | *1_76 | 2.0 | 4.25 | 2.02 | invention |
| 18 | methylphosphonic acid | 9.0 | *1_76 | 1.0 | 9.00 | 1.96 | invention |
| 19 | butyl phosphonic acid | 8.0 | *1_79 | 1.3 | 6.00 | 1.80 | invention |
| 20 | butyl phosphonic acid | 8.8 | *1_66 | 2.0 | 4.40 | 2.06 | invention |
| 21 | butyl phosphonic acid | 8.8 | *1_76 | 1.5 | 5.87 | 2.00 | invention |
| 22 | hexylphosphonic acid | 8.8 | *1_66 | 1.5 | 5.87 | 1.99 | invention |
| 23 | hexylphosphonic acid | 7.1 | *1_76 | 2.8 | 2.54 | 1.87 | invention |
| 24 | phenylphosphonic acid | 8.0 | *1_44 | 2.1 | 3.81 | 2.02 | invention |
| 25 | phenylphosphonic acid | 8.0 | *1_88 | 2.1 | 3.81 | 1.92 | invention |
| 26 | bromophenylphosphonic acid | 8.0 | *1_81 | 2.1 | 3.81 | 1.94 | invention |
| 27 | octyl phosphonic acid | 7.1 | *1_83 | 2.8 | 2.54 | 1.84 | invention |
| 28 | octyl phosphonic acid | 8.0 | *1_78 | 1.5 | 5.33 | 1.84 | invention |
| 29 | octyl phosphonic acid | 8.8 | *1_84 | 1.5 | 5.87 | 2.00 | invention |
| 30 | nonylphosphonic acid | 8.8 | *1_82 | 1.5 | 5.87 | 1.99 | invention |
| 31 | decylphosphonic acid | 8.8 | *1_82 | 1.5 | 5.87 | 1.99 | invention |
| 32 | dodecylphosphonic acid | 7.3 | *1_83 | 2.5 | 2.92 | 1.84 | invention |
| 33 | vinyl phosphonic acid | 8.8 | *1_70 | 1.5 | 5.87 | 1.99 | invention |
| 34 | vinyl phosphonic acid | 8.8 | *1_85 | 1.5 | 5.87 | 1.99 | invention |
| 35 | 2-bromoethylphosphon | 8.8 | *1_81 | 1.5 | 5.87 | 2.00 | invention |
| 36 | 2-bromoethylphosphon | 8.8 | *1_85 | 1.5 | 5.87 | 1.99 | invention |
| 37 | butyl phosphonic acid | 7.0 | *1_79 | 4.5 | 1.56 | 2.08 | comparison |
| 38 | butyl phosphonic acid | 9.8 | *1_40 | 5.4 | 1.81 | 2.77 | comparison |
| 39 | butyl phosphonic acid | 11 | *1_61 | 0.2 | 55.00 | 2.23 | comparison |
| 40 | ethyl phosphonic acid | 5.5 | *1_76 | 1 | 5.50 | 1.26 | comparison |
| 41 | ethyl phosphonic acid | 13 | *1_76 | 2.5 | 5.20 | 3.00 | comparison |
| 42 | butyl phosphonic acid | 8.8 | *2_A | 1.5 | 5.87 | 1.99 | comparison |
| 43 | butyl phosphonic acid | 8.8 | *2_B | 1.5 | 5.87 | 1.99 | comparison |

*1 compound example
*2 comparison compound

Evaluation of Near Infrared Absorbing Dispersions

The following evaluations were performed on the prepared near infrared absorbing dispersions.

Average Visible Light Transmittance of Dispersion

Each of prepared near infrared absorbing dispersions 1-43 was diluted with toluene such that the maximum spectral transmittance in the wavelength range of 850-1,000 nm was 10%. A spectral transmittance of the diluted dispersion in the wavelength range of 450-600 nm was measured with the spectrophotometer V-570 by JASCO Corporation. An average spectral transmittance in the range was calculated. A calculated average spectral transmittance in the wavelength range of 450-600 nm was evaluated according to the following criteria. Evaluation result is shown as average visible light transmittances in Table VI.

A) An average spectral transmittance in the range is 90% or more.
B) An average spectral transmittance in the range is 80% or more, and is less than 90%.
C) An average spectral transmittance in the range is 70% or more, and is less than 80%.
D) An average spectral transmittance in the range is less than 70%.

Average Particle Size of Fine Particles in Dispersion

Each of the prepared near infrared absorbing dispersions 1-43 was diluted with toluene such that a solid content concentration was 0.5% by mass. An average particle size of fine particles in the diluted dispersion was measured in a dynamic light scattering method using a zeta potential and particle size measurement system ELSZ-1000ZS by Otsuka Electronics Co. Ltd. The measured average particle size was evaluated according to the following criteria. Evaluation result is shown in Table VI.

A) An average particle size is 80 nm or less.
B) An average particle size is larger than 80 nm, and is 100 un or less.
C) An average particle size is larger than 100 nm, and is 200 nm or less.
D) An average particle size is larger than 200 nm.

Preparation of Near Infrared Absorbing Composition (Film)

Each of the prepared near infrared absorbing compositions (dispersions) 1-43 and a curable resin having a polysiloxane structure (KR-311 by Shin-Etsu Chemical Co., Ltd.) were mixed such that a solid content ratio of the resin was 70% by mass. Thus, coating liquids for forming near infrared absorbing films were prepared.

Next, each coating liquid for forming a near infrared absorbing film was cast on a glass substrate such that a film thickness has a maximum spectral transmittance of 10% within the wavelength range of 850-1.000 nm after curing. Prebake treatment was performed on a hot plate at 50° C. for 60 minutes. It was then cured on the hot plate by heating at 150° C. for 2 hours. Thus, the near infrared absorbing compositions (films) 1-43 were formed.

Evaluation of Near Infrared Absorbing Films

The following evaluation was performed on the prepared near infrared absorbing films.

Average Visible Light Transmittance

A spectral transmittance of the prepared near infrared absorbing films 1-43 in the wavelength range of 450-600 nm was measured using the spectrophotometer V-570 by JASCO Corporation. An average spectral transmittance in the range was calculated. At this time, influence of reflection at an interface was removed based on the glass substrate. Calculated average spectral transmittances in the wavelength range of 450-400 nm were evaluated according to the following criteria. Evaluation result is shown as average visible light transmittances in Table VI.
A) An average spectral transmittance in the range is 90% or more.
B) An average spectral transmittance in the range is 80% or more, and is less than 90%.
C) An average spectral transmittance in the range is 70% or more, and is less than 80%.
D) An average spectral transmittance in the range is less than 70%.

Moisture Resistance and Heat Resistance of Film

The prepared near infrared absorbing films 1-43 were stored at 85° C. and 85% RH for seven days. An average visible light transmittance after storage was measured in the same manner as the manner before storage. A value (average visible light transmittance difference) obtained by subtracting a value of the average visible light transmittance after storage from a value before storage was calculated. Calculated average visible light transmittance differences were evaluated according to the following criteria. Evaluation result is shown as moisture resistance and heat resistance in Table VI.
A) An average visible light transmittance difference is 3% or less.
B) An average visible light transmittance difference is larger than 3%, and is 5% or less.
C) An average visible light transmittance difference is larger than 5%, and is 10% or less.
D) An average visible light transmittance difference is larger than 10%.

Film Thickness

Film thicknesses of the prepared near infrared absorbing films 1 to 43 were measured using a film thickness meter which is a combination of the following.
Terminal—DIGIMICRO MH-ISM (Nikon)
Stand—DIGIMICRO STAND MS-5C (Nikon)
Reader—DIGITAL READ OUT TC-101A (Nikon)
Measured film thicknesses were evaluated according to the following criteria. Evaluation result is shown in Table VI.
A) A film thickness is 100 μm or less.
B) A film thickness is more than 100 μm, and is 150 μm or less.
D) A film thickness is more than 150 μm.

TABLE VI

| Near Infrared Absorbing Composition | Dispersion Evaluation | | Film Evaluation | | | |
|---|---|---|---|---|---|---|
| | Average Visible Light Transmittance | Average Particle Size | Average Visible Light Transmittance | Moisture Resistance and Heal Resistance | Film Thickness | Note |
| 1 | A | A | A | C | B | invention |
| 2 | A | A | A | A | A | invention |
| 3 | A | A | A | A | A | invention |
| 4 | C | C | C | A | A | invention |
| 5 | A | A | A | A | A | invention |
| 6 | A | A | A | A | A | invention |
| 7 | A | A | A | A | A | invention |
| 8 | A | A | A | A | A | invention |
| 9 | A | A | A | C | B | invention |
| 10 | A | A | A | A | A | invention |
| 11 | A | A | A | A | A | invention |
| 12 | C | C | C | A | A | invention |
| 13 | A | A | A | A | A | invention |
| 14 | A | A | A | A | A | invention |
| 15 | A | A | A | A | A | invention |
| 16 | A | A | A | A | A | invention |
| 17 | A | A | A | A | A | invention |
| 18 | A | A | A | A | A | invention |
| 19 | A | A | A | A | A | invention |
| 20 | A | A | A | A | A | invention |
| 21 | A | A | A | A | A | invention |
| 22 | B | B | B | A | A | invention |
| 23 | A | A | A | C | B | invention |
| 24 | B | B | B | B | B | invention |
| 25 | B | B | B | B | B | invention |
| 26 | B | B | B | B | B | invention |
| 27 | B | B | B | C | B | invention |
| 28 | B | B | B | A | B | invention |
| 29 | B | B | B | A | B | invention |
| 30 | B | B | B | A | B | invention |
| 31 | B | B | B | A | B | invention |

TABLE VI-continued

| Near Infrared Absorbing Composition | Dispersion Evaluation | | Film Evaluation | | | |
|---|---|---|---|---|---|---|
| | Average Visible Light Transmittance | Average Particle Size | Average Visible Light Transmittance | Moisture Resistance and Heal Resistance | Film Thickness | Note |
| 32 | B | B | B | C | B | invention |
| 33 | A | A | A | A | A | invention |
| 34 | A | A | A | A | A | invention |
| 35 | A | A | A | A | A | invention |
| 36 | A | A | A | A | A | invention |
| 37 | C | C | C | D | D | comparison |
| 38 | C | C | C | D | D | comparison |
| 39 | D | D | D | B | A | comparison |
| 40 | D | D | D | C | A | comparison |
| 41 | D | D | D | C | B | comparison |
| 42 | D | D | D | C | A | comparison |
| 43 | D | D | D | B | A | comparison |

Example 2

Preparation of Near Infrared Absorbing Compositions (Dispersions)

Preparation of Near Infrared Absorbing Composition (Dispersion) 44

Solution C was prepared so as to have the same composition as the prepared near infrared absorbing composition (dispersion) 3. The following organic dye was dissolved in 36 g of anisole and was added to Solution C.

FDR004 (Yamada Chemical Industry Co., Ltd.) (maximum absorption wavelength 716 nm) 1.98 mg
FDR005 (Yamada Chemical Co., Ltd.) (maximum absorption wavelength 725 nm) 1.07 mg
Lumogen IR765 (BASF) 4.07 mg Solution C, to which the organic dye dissolved in anisole was added, was put in a flask. While heating at 55-90° C. in the oil bath (OSB-2100 by Tokyo Rika Kikai Co., Ltd.), desolvating and diacetic acid treatment were performed for 3 hours by the rotary evaporator (N-1000 by Tokyo Rika Kikai Co., Ltd.).

Then, an amount of a solvent was adjusted such that a solid content concentration of Solution C in the flask was 10% by mass. This is the near infrared absorbing composition (dispersion) 44.

Preparation of Near Infrared Absorbing Composition (Dispersion) 45

The near infrared absorbing composition (dispersion) 45 was prepared in the same manner except that the organic dye added to Solution C was replaced with the following organic dye.

1,1'-Dibutyl-3,3,3',3'-tetramethyl-indotricarbocyanine Hexafluorophosphate (Tokyo Kasei Co., Ltd.) (maximum absorption wavelength 766 nm) 8.03 mg
FDR004 (Yamada Chemical Industry Co., Ltd.) (maximum absorption wavelength 716 nm) 2.47 mg Preparation of Near Infrared Absorbing Composition (Dispersion) 46

The near infrared absorbing composition (dispersion) 46 was prepared in the same manner except that the organic dye added to Solution C was replaced with the following organic dye.

Squarylium dye (maximum absorption wavelength 710 nm) 1.23 mg
FDR005 (Yamada Chemical Co., Ltd.) (maximum absorption wavelength 725 nm) 1.34 mg
Lumogen IR765 (BASF) 3.05 mg The squarylium dye (maximum absorption wavelength 710 nm) was the dye (A11-1) described in Japanese Patent No. 624895.

Compositions of the near infrared absorbing compositions 44-46 are shown in Table VII below.

TABLE VII

| Near Infrared Absorbing Composition No. | First Compound Having Structure Represented by General Formula (I) | | Second Compound Having Structure Represented by General Formula (II) | | Molar Ratio | | Note |
|---|---|---|---|---|---|---|---|
| | Type | CA (mmol) | Type | CE (mmol) | CA/CE | CH/CC | |
| 44 | ethyl phosphonic acid | 8.8 | compound example 76 | 1.5 | 5.87 | 2.00 | Invention |
| 45 | ethyl phosphonic acid | 8.8 | compound example 76 | 1.5 | 5.87 | 2.00 | Invention |
| 46 | ethyl phosphonic acid | 8.8 | compound example 76 | 1.5 | 5.87 | 2.00 | Invention |

Evaluation of Near Infrared Absorbing Dispersions

An "average visible light transmittance of a dispersion" and an "average particle size of fine particles in a dispersion" of each of the prepared near infrared absorbing dispersions 44-46 were measured in the same manner as the manner in Example 1. They were evaluated according to the same criteria. Evaluation result is shown in Table VIII.

Preparation of Near Infrared Absorbing Composition (Film)

Each of the prepared near infrared absorbing compositions (dispersions) 44-46 and a curable resin having a polysiloxane structure (KR-311 by Shin-Etsu Chemical Co., Ltd.) were mixed such that a solid content ratio of the resin was 50% by mass. Thus, coating liquids for forming near infrared absorbing films were prepared.

Next, each coating liquid for forming a near infrared absorbing film was cast on a glass substrate such that a film thickness has a maximum spectral transmittance of 10% within the wavelength range of 850-1,000 nm after curing. Prebake treatment was performed on a hot plate at 50° C. for 60 minutes. It was then cured on the hot plate by heating at 150° C. for 2 hours. Thus, the near infrared absorbing compositions (films) 44-46 were formed.

Evaluation of Near Infrared Absorbing Films

An "average visible light transmittance of a film", "moisture resistance and heat resistance of a film", and a "film thickness" of each of the prepared near infrared absorbing films 44-46 were measured in the same manner as the manner in Example 1. They were evaluated according to the same criteria. Evaluation result is shown in Table VIII.

absorbing composition films 47-49. As a result, it was confirmed that a spectral transmittance of any of the near infrared absorbing composition films decreased as the wavelength increased within the range. It was confirmed that a cutoff wavelength (wavelength at which a spectral transmittance is 50%) of any of the near infrared absorbing composition films within the range is within the wavelength range of 600-680 nm.

SPECTROSCOPIC TRANSMITTANCE OF FILM IN WAVELENGTH RANGE OF 750-1,080 nm

Spectral transmittances of the prepared rear infrared absorbing composition films 47-49 were measured in the wavelength range of 750-1,080 nm. As a result, it was confirmed that a spectral transmittance of any of the near infrared absorbing composition films was 1% or less within the range. That is, it was confirmed that an average spectral transmittance within the range was 1% or less.

Although embodiments of the present invention have been described and illustrated in detail, the disclosed embodiments are made for purposes of illustration and example only and not limitation. The scope of the present invention should be interpreted by terms of the appended claims.

The entire disclosure of Japanese patent application No. 2020-160339, filed on Sep. 25, 2020, is incorporated herein by reference in its entirety.

TABLE VIII

| Near Infrared Absorbing Composition No. | Dispersion Evaluation | | Film Evaluation | | | Note |
|---|---|---|---|---|---|---|
| | Average Visible Light Transmittance | Average Particle Size | Average Visible Light Transmittance | Moisture Resistance and Heat Resistance | Film Thickness | |
| 44 | A | A | A | A | A | Invention |
| 45 | A | A | A | A | A | Invention |
| 46 | A | A | A | A | A | Invention |

Example 3

Preparation of Near Infrared Absorbing Composition (Film)

The prepared near infrared absorbing composition (dispersion) 44 and a curable resin having a polysiloxane structure (KR-311 by Shin-Etsu Chemical Co., Ltd.) were mixed such that a solid content ratio of the resin was 50% by mass. Thus, a coating liquid for forming a near infrared absorbing film was prepared.

Next, the coating liquid for forming a near infrared absorbing film was cast on a glass substrate so as to have a film thickness of 100 μm after curing. Prebake treatment was performed on a hot plate at 50° C. for 60 minutes. It was then cured on the hot plate by heating at 150° C. for 2 hours. Thus, the near infrared absorbing composition (film) 47 was formed.

The near infrared absorbing compositions (films) 48, 49 were formed to have film thicknesses of 100 μm in the same manner as the prepared near infrared absorbing compositions (dispersions) 45, 46.

Evaluation of Near Infrared Absorbing Films Cutoff Wavelength of Film

A spectral transmittance for light in the wavelength range of 600-700 un incident on a surface at an incident angle of 0° was measured for each of the prepared near infrared

What is claimed is:

1. A near infrared absorbing composition comprising:
a near infrared absorber that contains at least one of:
Ingredient (A) that consists of a first compound having a first structure represented by General Formula (I), a second compound having a second structure represented by General Formula (II), and a copper ion; and

General Formula (I)

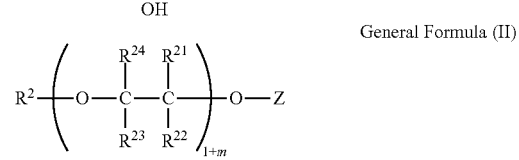

General Formula (II)

Ingredient (B) that consists of a first copper complex in which the first compound is coordinated and a second copper complex in which the second compound is coordinated, wherein in General Formula (I), $R^1$ represents an alkyl group containing 1-20 carbons or an aryl group containing 6-20 carbons, and may further have a substituent, in General Formula (II), $R^2$ represents an alkyl group containing 1-20 carbons or an aryl group containing 6-20 carbons, and may further have a substituent, each of $R^{21}$ to $R^{24}$ represents a hydrogen atom or an alkyl group containing 1-4 carbons, "l" represents an average number of added partial structures in which $R^{21}$ to $R^{24}$ are all hydrogen atoms, and is in a range of 1-19, "m" represents an average number of added partial structures in which at least one of $R^{21}$ to $R^{24}$ is an alkyl group containing 1-4 carbons, and is in the range of 1-19, "l+m" is a sum of "l" and "m", and is in a range of 2-20, "Z" represents a structural unit selected from General Formulae (Z-1) to (Z-3),

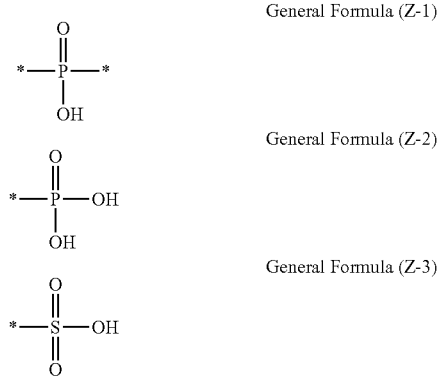

"*" represents a binding site and is combined with "O" in General Formula (II), a molar ratio CA/CE is in a range of 3.8-10, wherein
CA is a molar content of the first compound, and
CE is a molar content of the second compound, and
a molar ratio CH/CC is in a range of 1.5-2.5, wherein
CC is a molar content of copper ions, and
CH is a molar content of reactive hydroxy groups contained in the first compound and the second compound.

2. The near infrared absorbing composition according to claim 1, wherein $R^1$ in General Formula (I) is an alkyl group containing 1-20 carbons.

3. The near infrared absorbing composition according to claim 1, further comprising:
an organic dye.

4. The near infrared absorbing composition according to claim 3, wherein the organic dye is a quaterylene derivative, a phthalocyanine derivative, a cyanine derivative, or a squarylium derivative.

5. The near infrared absorbing composition according to claim 1, further comprising:
a curable resin,
wherein the near infrared absorbing composition is in a state of a cured film.

6. The near infrared absorbing composition according to claim 5, wherein
an average spectral transmittance is 80% or more in a wavelength range of 450-600 nm,
an average spectral transmittance is 10% or less in a wavelength range of 850-1000 nm, and
a film thickness is in a range of 10-150 μm.

7. The near infrared absorbing composition according to claim 6, wherein
an average spectral transmittance is 1% or less in a wavelength range of 750-1080 nm,
a spectral transmittance decreases as a wavelength increases in a wavelength range of 600-700 nm,
a cutoff wavelength for light incident on a surface at an incident angle of 0° is in a range of 600-680 nm, the cutoff wavelength being a wavelength in which a spectral transmittance is 50% in the wavelength range of 600-700 nm, and
a film thickness is in a range of 10-100 μm.

8. A near infrared cut filter, comprising:
a transparent dielectric substrate; and
a near infrared absorbing layer which contains the near infrared absorbing composition according to claim 1 and which is on at least one side of the transparent dielectric substrate.

9. The near infrared cut filter according to claim 8, further comprising:
a dielectric multilayer film on at least one side of the transparent dielectric substrate.

10. A solid state image sensor, comprising:
the near infrared cut filter according to claim 8.

11. A camera module, comprising:
the solid state image sensor according to claim 10.

12. The near infrared absorbing composition according to claim 1, wherein, in General Formula (I), $R^1$ represents the alkyl group containing 1-20 carbons and may further have the substituent.

* * * * *